United States Patent

Nakatani

[11] Patent Number: 5,900,754
[45] Date of Patent: May 4, 1999

[54] DELAY CONTROL CIRCUIT

[75] Inventor: Takashi Nakatani, Hyogo, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 08/936,819

[22] Filed: Sep. 24, 1997

[30] Foreign Application Priority Data

May 16, 1997 [JP] Japan ..................................... 9-127051

[51] Int. Cl.⁶ ...................................................... H03K 5/159
[52] U.S. Cl. .......................... 327/158; 327/156; 327/276; 327/141; 327/149; 327/151; 327/153; 327/150; 327/277; 327/371; 327/373
[58] Field of Search ..................... 327/149, 151, 327/153, 150, 158, 161, 252, 276, 277; 375/371, 373

[56] References Cited

U.S. PATENT DOCUMENTS 3,479,598  11/1969  Weller ...................................... 375/373
4,813,005  3/1989  Redig et al. ............................. 364/580

*Primary Examiner*—Timothy P. Callahan
*Assistant Examiner*—April Giles
*Attorney, Agent, or Firm*—Leydig, Voit & Mayer

[57] ABSTRACT

A D flip-flop latches a reference clock signal in response to an output signal fed back from an output circuit. A pulse generating circuit generates a pulse in response to the output signal fedback from the output circuit. From the latched signal and the pulse generated by the pulse generating circuit, a count pulse is generated. The count pulse is output to an up/down counter. Based on the counting result of the up/down counter, a digital-to-analog conversion circuit generates a delay control signal. Using this delay control signal, the delay circuit synchronizes its output signal with the reference clock signal. It is possible to synchronize the output data signal with the reference clock signal regardless of variations in the reference clock signal, source voltage, and ambient temperature.

10 Claims, 20 Drawing Sheets

FIG. 5A REFERENCE CLOCK SIGNAL (101)
FIG. 5B INPUT DATA SIGNAL (102)
FIG. 5C OUTPUT OF D FLIP-FLOP 1 (203)
FIG. 5D OUTPUT OF CONTROL CIRCUIT 5 (204)
FIG. 5E OUTPUT DATA SIGNAL (103)

FIG. 7A  INPUT DATA SIGNAL (203)

FIG. 7B  CHARGE/DISCHARGE CURRENT WAVEFORM OF CAPACITOR (213)

FIG. 7C  OUTPUT DATA SIGNAL (204)

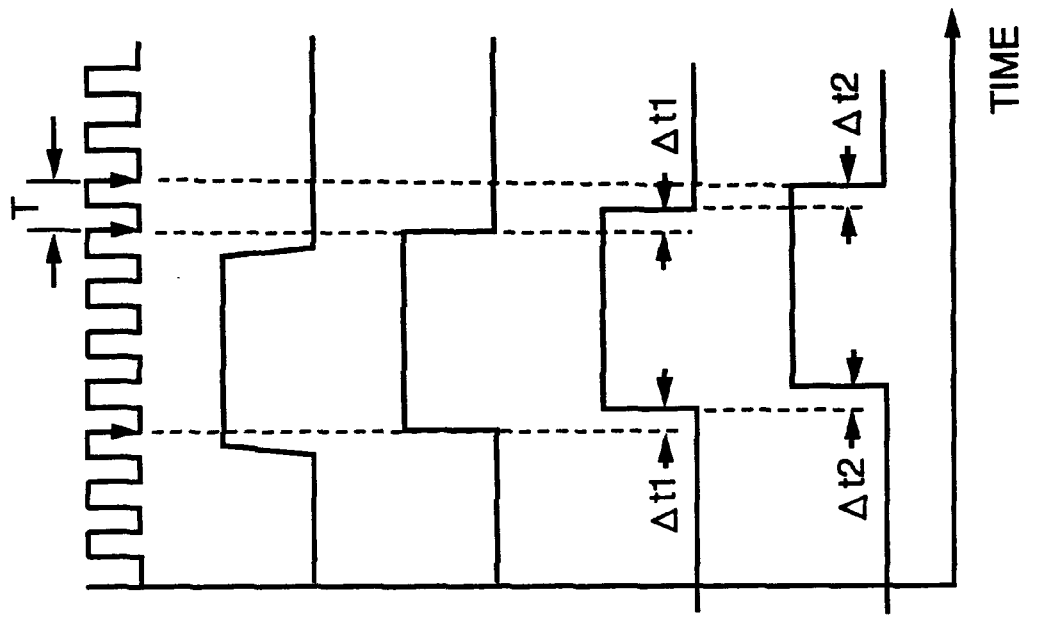
FIG. 19A  REFERENCE CLOCK SIGNAL (101)
FIG. 19B  INPUT DATA SIGNAL (102)
FIG. 19C  OUTPUT OF D FLIP-FLOP 1 (203)
FIG. 19D  OUTPUT OF DELAY CIRCUIT 2 (204)
FIG. 19E  OUTPUT DATA SIGNAL (103)
(PRIOR ART)

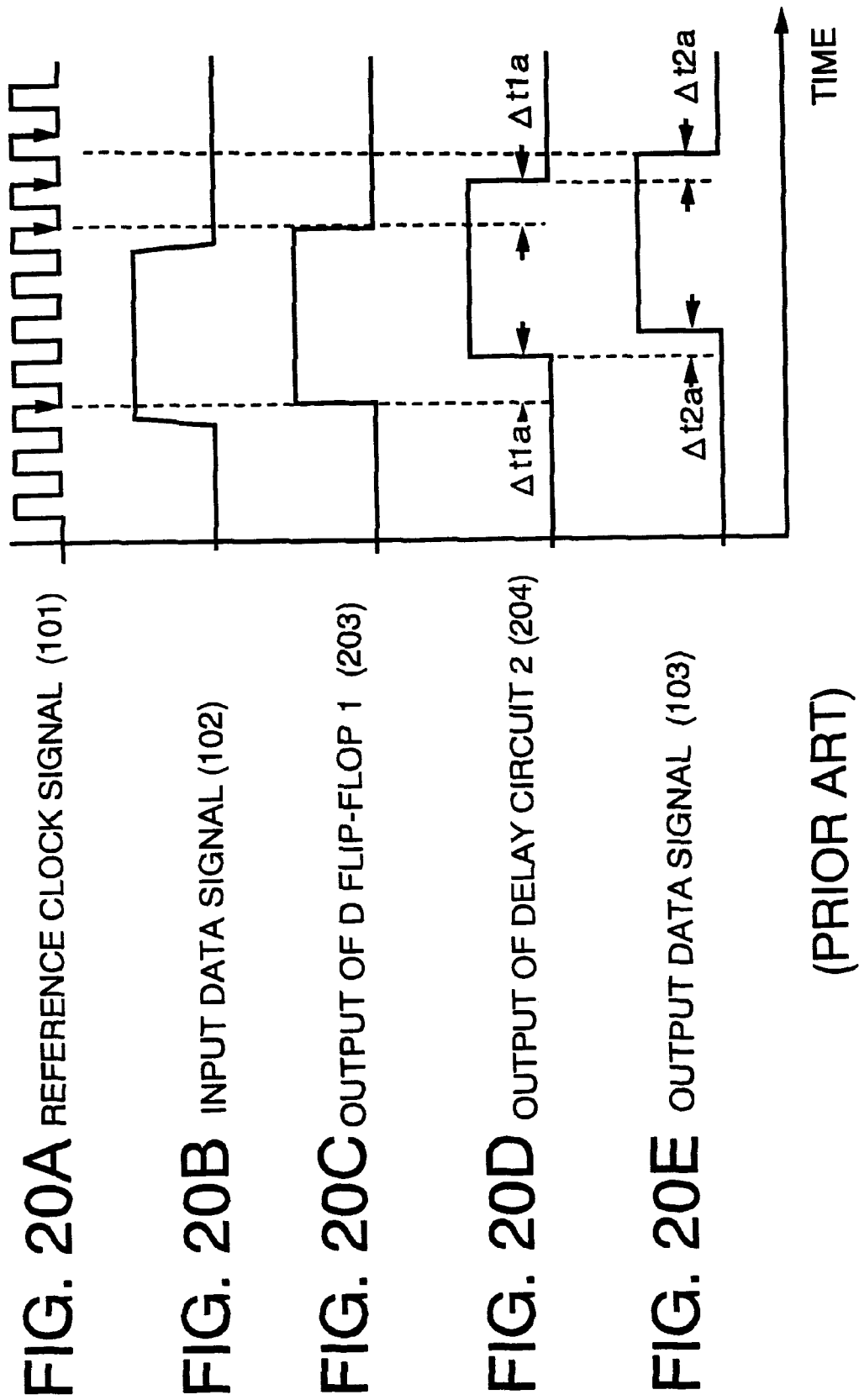

DELAY CONTROL CIRCUIT

BACKGROUND OF THE INVENTION

1. Field of the Invention

The invention relates to a delay control circuit, more particularly to a delay control circuit for synchronizing the phase of an input data signal with a reference clock signal.

2. Description of the Prior Art

FIG. 15 shows a display system for displaying an indication, such as a channel indication, on a monitor 400 simultaneously with a television picture. The display system of FIG. 15 includes a television signal input terminal 104 for receiving a television signal, a television tuner 200 for converting a television signal to a picture signal, a data signal input terminal 102 for receiving a data signal, such as channel number superimposed on the monitor 400, a delay control circuit 100 for image-processing the data signal input to the input terminal 102, a reference clock input terminal 101 for receiving a reference clock to be supplied to the delay control circuit 100 and the television tuner 200, a line memory 300 for storing picture elements corresponding to one scanning line, a monitor 400 such as a Braun tube, a plasma display, a liquid crystal panel (TFT), or a television display 401 in the monitor 400 for displaying the television picture received from the television tuner 200 and the channel indication received from the delay control circuit 100.

In FIG. 15, the television signal input to the television signal input terminal 104 is image-processed by the television tuner 200 and transmitted to the line memory 300 for each scanning line. On the other hand, the data signal input to the data signal input terminal 102 is image-processed by the delay control circuit 100 and transmitted to the line memory 300 for each scanning line. The television signal output from the television tuner 200 and the data signal output from the delay control circuit 100 are composed by the line memory 300 and displayed on the monitor 400. The data signal is displayed at a fixed location of the monitor 400.

The reference clock signal is supplied to the television tuner 200 and the delay control circuit 100 via the reference clock input terminal 101. The television tuner 200 and the delay control circuit 100 are processed by the same reference clock signal, respectively. Each output signal from the delay control circuit 100 and the television tuner 200 is output to the line memory 300 and superimposed and displayed on the monitor 400. Therefore, if the output signal from the television tuner 200 and the output signal from the delay control circuit 100 are not synchronized, the television signal from the television tuner 200 and the data signal from the delay control circuit 100 are shifted in the line memory 300, and therefore the data signal from the delay control circuit 100 is not displayed on a desired location on the monitor 400. Accordingly, the delay control circuit 100 must precisely synchronize the data signal input from the data signal input terminal 102 with the reference clock signal.

For such a delay control circuit, for example, a circuit using the delay circuit shown in FIG. 16 is known. FIG. 16 is a block diagram showing a conventional delay control circuit for controlling delay of the input data signal against the reference clock input signal. FIG. 17 shows an example of the delay circuit 2 of FIG. 16. FIG. 18 shows an example of an output circuit 3 of FIG. 16. FIGS. 19A–19E are timing charts showing the operation of the delay control circuit shown in FIG. 16.

In FIG. 16, a terminal T of a D flip-flop 1 is supplied with the reference clock signal via the reference clock input terminal 101 (see FIG. 19A), and the terminal D of the D flip-flop 1 is supplied with a data signal (see FIG. 19B), such as a superimposed signal supplied via the data signal input terminal 102. The delay circuit 2 delays the data signal from the D flip-flop 1 by a predetermined time and outputs it to an output circuit 3. The output circuit 3 gives a predetermined delay to the data signal output from the delay circuit 2 and outputs the delayed data signal to an output terminal 103 so that it is synchronized with the reference clock signal.

The delay circuit 2 of FIG. 17 includes an input terminal 203, a plurality of inverters 4a–4d, and an output terminal 204, and has a delay corresponding to the sum of delays of these inverters. The output circuit 3 of FIG. 18 includes an input terminal 204, inverters 4e–4h, and an output terminal 103. The output circuit 3 has the delay corresponding to the sum of delays of these inverters. Further, the output circuit 3 not only provides a delay, but also operates as a buffer for an external circuit.

The operation of the conventional delay control circuit shown in FIG. 16 is described below using FIGS. 19A–19E. FIG. 19C shows that the input data signals shown in FIG. 19B, input from the outside, is latched at the falling edges of the reference clock signal shown in FIG. 19A and is synchronized with the reference clock signal. The data signal output from the D flip-flop 1 is delayed by a predetermined delay $\Delta$ t1 in the delay circuit 2 as shown in FIG. 19D. Further, the output circuit 3 gives a predetermined delay $\Delta$ t2 to the output terminal 103 as shown in FIG. 19E. By adjusting the sum ($\Delta$ t1+$\Delta$ t2) of the delay $\Delta$ t1 and $\Delta$ t2 to equal the period T of the reference clock signal, that is, $\Delta$ t1+$\Delta$ t2=T, the data signal output from the output circuit 3 can be synchronized with the falling edge of the reference clock signal.

In this way, in the conventional delay control circuit, the number of stages of the inverters 4a–4d in the delay circuit 2 and the number of the stages of the inverters 4e–4h in the output circuit 3 are set so that the sum of the delay of the circuit ($\Delta$ t1+$\Delta$ t2) is the same as the period T. In this way, by the cascade connection of a plurality of the inverters, the input data signal is output synchronously with the reference clock signal at a change point of the reference clock signal, with the fixed delay (inherent delay determined by the inverter).

However, in the conventional current delay control circuit, the delay depends on the number of inverters. Therefore, when there are some changes in the ambient temperature and the source voltage supplied to the delay control circuit, the delay changes according to the external conditions. In other words, if the ambient temperature or the source voltage changes, the length of the delay shifts from the period of the reference clock signal and the output data signal is not synchronized with the reference clock signal at the falling edge of the reference clock signal.

For example, when the source voltage decreased or the ambient temperature increases, the length of the delay increases in each inverter in the delay circuit 2 and the output circuit 3, so the total delay of the delay control circuit also increases. FIGS. 20A–20E are timing charts showing signals at respective points in the delay control circuit of FIG. 16 when the source voltage decreases or the ambient temperature increases. As shown in FIG. 20B, the rise and fall of the input data signals, such as a superimposed signal received from the outside, are latched at each falling edge of the reference clock signal as shown in FIG. 20A, so the output signal from the D flip-flop 1 is synchronized with the reference clock as shown in FIG. 20C. The output signal from the D flip-flop 1 is delayed in the delay circuit 2. However, if the source voltage falls or the ambient temperature rises, a delay $\Delta$ t1a, which is larger than the normal delay $\Delta$ t1, is generated as shown in FIG. 20D. Further, in the output circuit 3, a delay $\Delta$ t2a, which is larger than the normal delay $\Delta$ t2, is generated as shown in FIG. 20E. Therefore, since the predetermined delay ($\Delta$ t1+$\Delta$ t2) is changed to ($\Delta$ t1a+$\Delta$ t2a) via the delay circuit 2 and the output circuit 3, the delay ($\Delta$ t1a+$\Delta$ t2a) becomes larger than T ($\Delta$ t1a+$\Delta$ t2a>T) and the output data signal from the output circuit 3 does not synchronize with the reference clock signal at the falling edges of the reference clock signal as shown in FIG. 20E. From this reason, there is a serious problem in that the input data signal is not displayed at a desired location on the monitor 400. Further, there is a disadvantage in that the superimposed picture becomes unstable since jitter occurs in the superimposed picture.

SUMMARY OF THE INVENTION

It is an object of the present invention to provide a delay control circuit for reducing variation in the length of a delay due to a variation in the reference clock signal, the source voltage, or the ambient temperature, and outputting an output data signal synchronous with the reference clock signal at changing points of the reference clock signal.

According to one aspect of the invention, a delay control circuit for synchronizing a data signal input with a reference clock signal includes first holding means for holding a data signal in response to a change in a reference clock signal, a delay length control circuit for delaying the data signal received from the first holding means, and an output circuit for delaying an output signal of the delay length control circuit to synchronize the data signal with the reference clock signal where the data signal input to the delay length control circuit is delayed by the delay length control circuit in response to the reference clock signal and a delayed data signal fedback from an output terminal of the output circuit to the delay length control circuit.

According to another aspect of the invention, a delay control circuit includes a delay control signal generating circuit for generating a delay control signal in response to the reference clock signal and delayed data signal, and delay means for delaying the input data signal held in the first holding means in response to the delay control signal.

According to a further aspect of the invention, the delay control signal generating circuit includes second holding means for holding the reference clock signal in response to the delayed data signal, a pulse generating circuit for generating a pulse in response to the delayed data signal, first operating means for carrying out a NAND operation between a pulse from the pulse generating circuit and a non-inverting output signal of the second holding means, second operating means for carrying out a NAND operation between a pulse from the pulse generating circuit and an inverted output signal from the second holding means, a counter for counting output signals from the first and second operating means, and a convertor for converting the output of the counter into a direct current signal.

According to a still further aspect of the invention, the delay means in the delay length control circuit of the delay control circuit includes a first active element changing its dynamic resistance in response to level of the delay control, a second active element for charging and discharging a capacitor in response to an output signal from the first holding means, and a third active element turning on and off in response to a voltage charged on the capacitor to produce a delayed output signal.

According to a still further aspect of the invention, a delay control circuit includes an input circuit having an input terminal receiving the reference clock signal and producing an output signal supplied to a first input terminal of the phase comparator in the phase locked loop circuit, a delay length control circuit having an input terminal supplied with the output from the VCO in the phase locked loop circuit, a clock terminal receiving the reference clock signal, and a control terminal receiving a control signal fedback from the output terminal of the output circuit, for delaying the output from the VCO and outputting it to a second input terminal of the phase comparator in the phase locked loop circuit, a latch circuit for latching an input data signal in response to the output signal of the VCO, and a delay circuit for delaying an output of the latch circuit.

BRIEF DESCRIPTION OF THE DRAWINGS

FIGS. 19A–19E are timing charts showing the operation of the conventional delay control circuit.

FIGS. 20A–20E are timing charts showing the operation of the conventional delay control circuit.

DETAILED DESCRIPTION OF THE PREFERRED EMBODIMENTS

Embodiment 1

Figure 1:
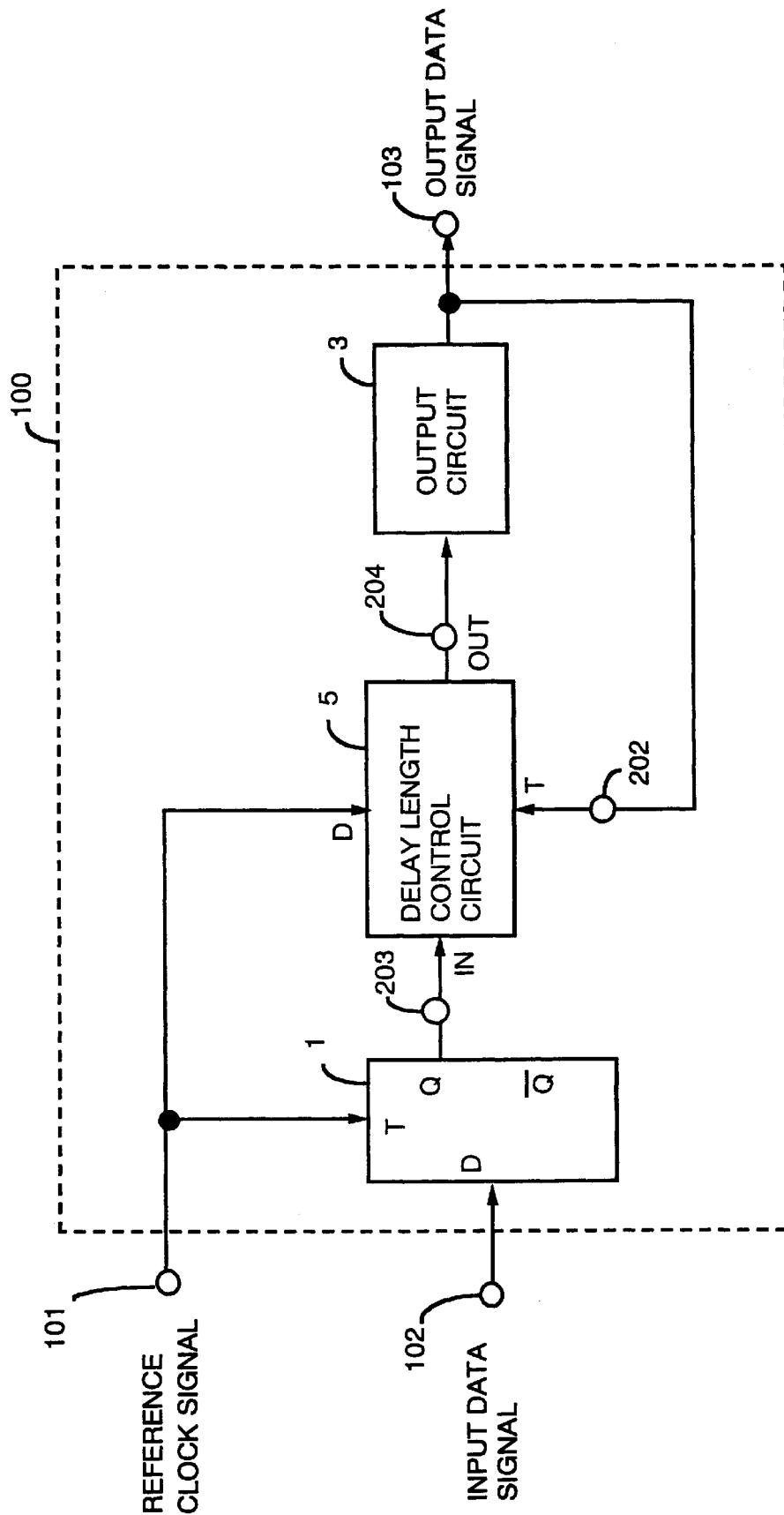
FIG. 1 is a block diagram showing a delay control circuit of an embodiment of the present invention.
Figure 2:
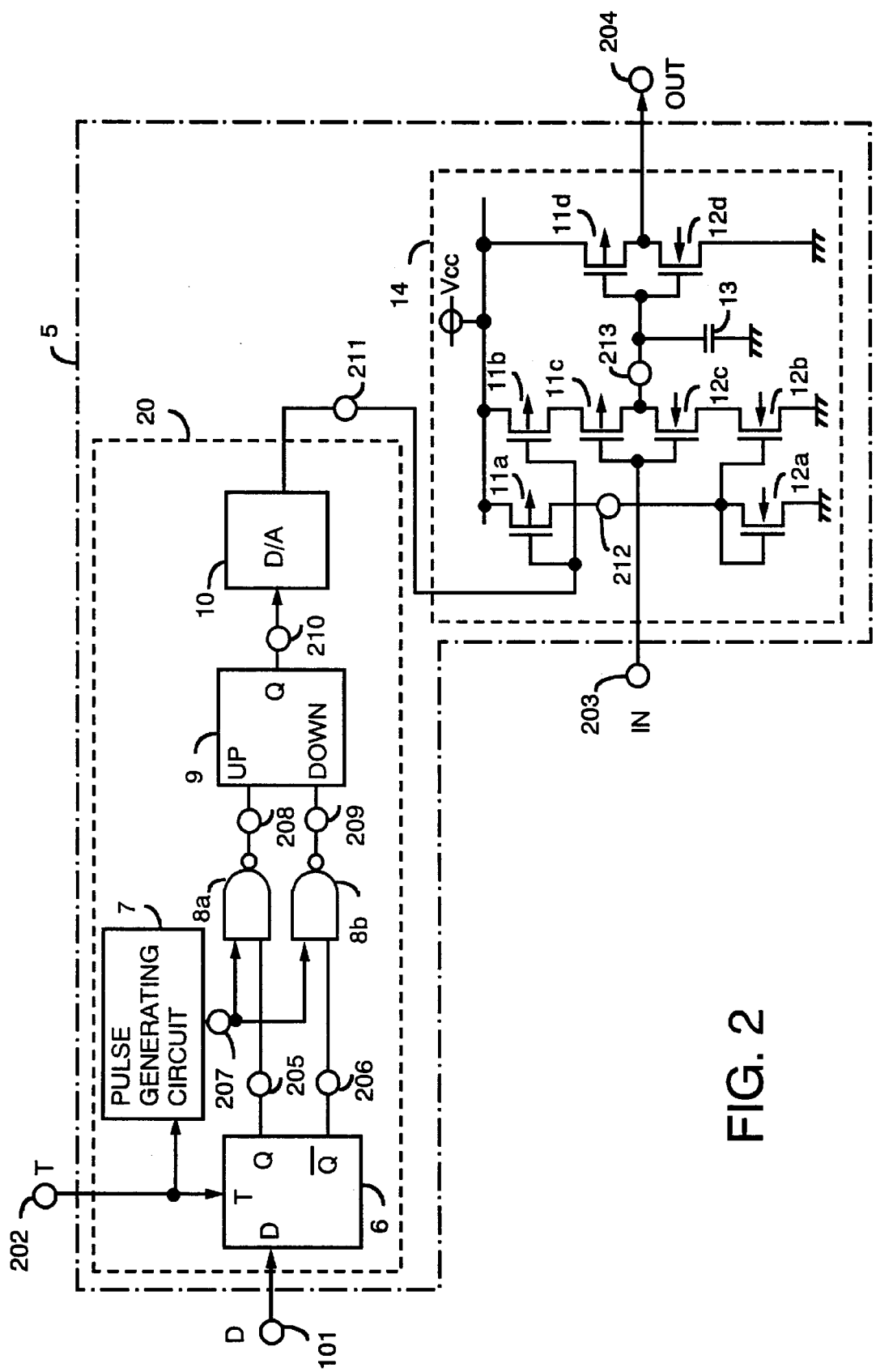
FIG. 2 is a block diagram showing a detailed delay control circuit of a first embodiment of the present invention.

The present invention is explained with reference to the drawings focusing on a delay control circuit of a first embodiment. FIG. 1 is a block diagram showing a delay control circuit 100 of the first embodiment of the present invention. FIG. 2 is a block diagram showing a detailed delay length control circuit 5 in the delay control circuit 100 of the first embodiment of the present invention. FIGS. 3A–3E are timing charts for explaining the operation of a delay control circuit 100 shown in FIG. 1. FIGS. 4A–4H are timing charts for explaining the operation of a delay length control circuit 5 shown in FIG. 2.

Figure 3:
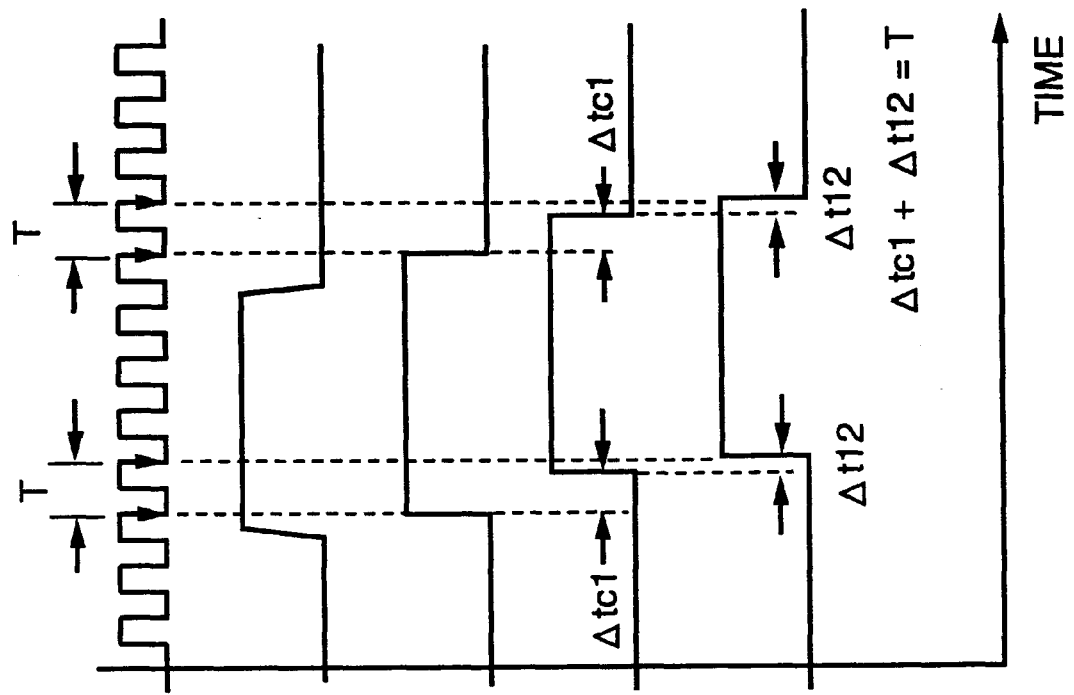
FIGS. 3A–3E are timing charts for explaining the operation of a delay control circuit according to the first embodiment when the falling edge of an output data signal is ahead of a reference clock signal.

In FIG. 1, a reference clock signal is input to a terminal T of a D flip-flop 1 via a reference clock input terminal 101 (FIG. 3A) and a data signal is input to a terminal D of a D flip-flop 1 via a data signal input terminal 102 (FIG. 3B). The data signal latched in response to the reference clock signal is output from a terminal Q of the D flip-flop 1 to a terminal 203 (FIG. 3C). A delay length control circuit 5 receives a data signal latched in response to the reference clock signal from D flip-flop 1 via the terminal 203, the reference clock signal via the terminal 101 and an output data signal of an output circuit 3 via a terminal 202. The delay length control circuit 5 adjusts the delay of the data signal input from the D flip-flop 1 so that variations of the source voltage or the ambient temperature can be neglected, and an output data signal from a terminal 103 can be synchronized with the reference clock signal. The output signal from the delay control circuit 5 is input to the output circuit 3 via a terminal 204, which gives a fixed length delay to the data signal in the output circuit 3. The output signal from the output circuit 3 with the delay is output to a line memory 300 shown in FIG. 15 via the terminal 103.

Figure 18:
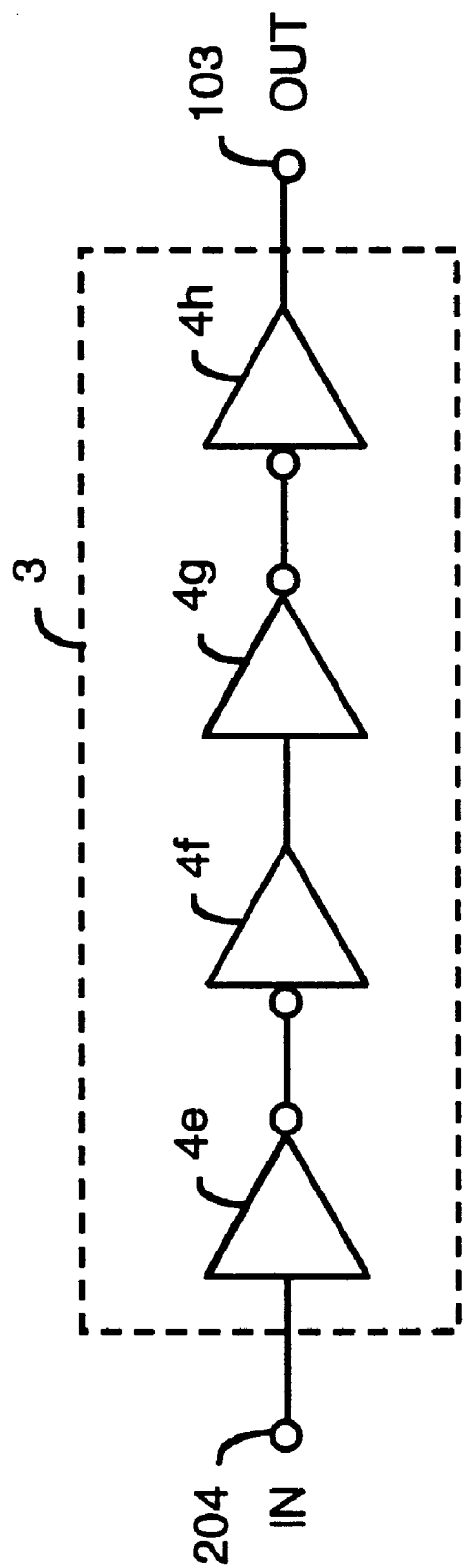
FIG. 18 shows a conventional output circuit.

The output circuit 3 in FIG. 1 is the same as the circuit shown in FIG. 18. The data signal delayed by the delay length control circuit 5 is input to the output circuit 3 via an input terminal 204, is delayed by several inverters 4e–4h, and is output to the terminal 103. The output circuit 3 operates as a buffer, while providing a delay equivalent to the sum of delays of inverters. The output data signal from the output circuit 3 is output to the output terminal 103 of the delay control circuit 100, and fedback to the delay length control circuit 5 via a terminal 202. The fedback signal is used as a signal for generating a pulse in a pulse generating circuit described later and a signal for latching the reference clock signal.

[when the output data signal is ahead of the reference clock signal]

The operation of the delay control circuit of FIG. 1 when the output data signal is ahead of the reference clock signal is described below. The data signal input via the data signal input terminal 102 is latched in response to the reference clock signal input to the reference clock input terminal 101, so the signal shown in FIG. 3C is obtained from the terminal 203. The data signal input to the input terminal 203 is delayed by Δ tc1 by the delay control signal at the terminal 211, generated in the delay length control circuit 5 (described later) and output to the terminal 204. The data signal on the terminal 204 is delayed by Δ t12 in the output circuit 3 and output to the output terminal 103 of the delay control circuit 100. The data signal output from the output terminal 103 can be synchronized with the fall edge of the reference clock signal by adjusting the sum of the delays Δ tc1 and Δ t12 to be an integer times as long as the period T of the reference clock signal. The data signal output from the output terminal 103 in the delay control circuit 100 is output to a line memory 300 shown in FIG. 15 and is superimposed on the television signal and displayed on the monitor 400. The delay Δ t12 means a delay time determined by the output circuit 3 and it is not possible to adjust that delay time. The delay Δ tc1 means a delay time determined by the delay length control circuit 5 and is related to a specific feature of the present invention.

The operation of the delay length control circuit 5 in the control circuit 100 of the first embodiment of the present invention is described below. The delay length control circuit 5 of FIG. 2 includes an input terminal 101 where the reference clock signal shown in FIG. 3A is input, an input terminal 202 where the output data signal (FIG. 3E) from the output circuit 3 is input, a terminal 203 where the data signal output from the D flip-flop 1 is input, and an output terminal 204 where the data signal is output from the delay length control circuit 5. In the delay length control circuit 5 of FIG. 2, a D terminal 101 of a D flip-flop 6 receives the reference clock signal and a terminal T 202 receives the output data signal of the output circuit 3. The D flip-flop 6 latches the reference clock signal input from the terminal 101 at the falling edge of the output signal input to the terminal T 202 as described below.

Figure 4:
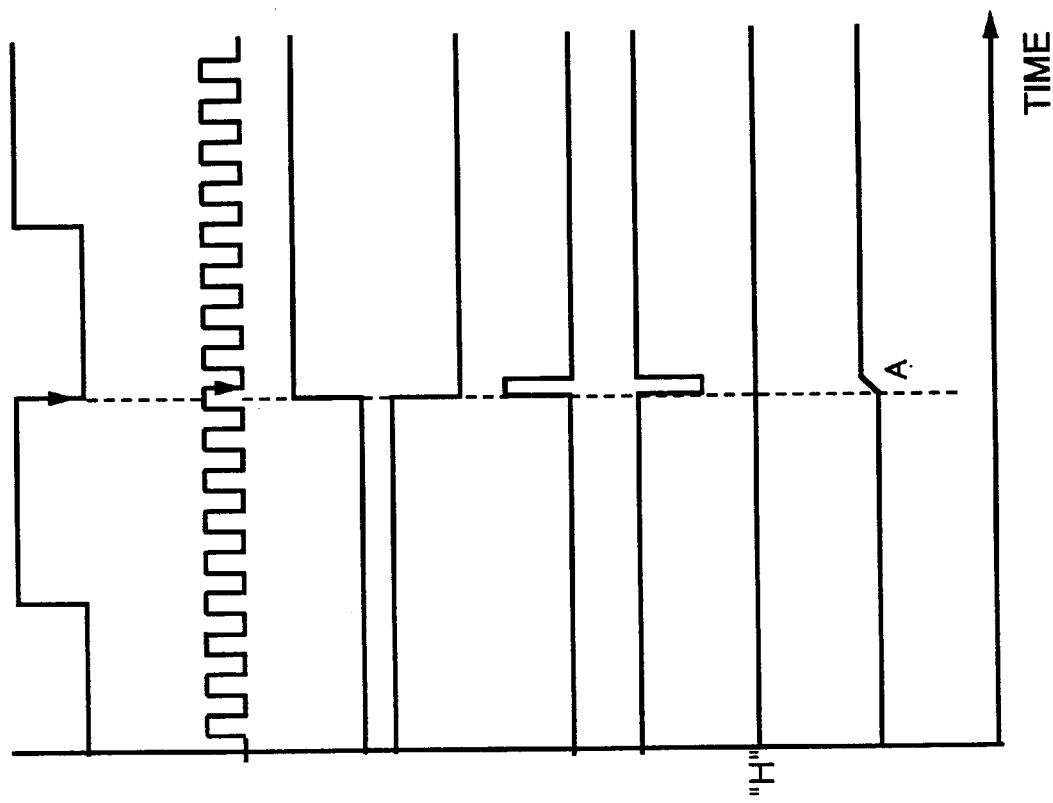
FIGS. 4A–4H are timing charts for explaining the operation of a delay control circuit according to the first embodiment when the output data signal is ahead of the reference clock signal.

FIGS. 4A–4H are timing charts for explaining the generation of a delay control signal when the output data signal is ahead of the reference clock signal in a delay control signal generating circuit 20 in the delay length control circuit 5. When the falling edge of the output data signal is ahead of the reference clock signal, the D flip-flop 6 outputs a signal changing from logic "L" to logic "H" at the output terminal Q of the D flip-flop 6 as shown in FIG. 4C. Then a pulse generating circuit 7 outputs a one-shot pulse having a predetermined pulse width as shown in FIG. 4E upon receiving the output data signal stated above via the terminal 202.

The pulse output from the pulse generating circuit 7 is supplied to one input terminal of a NAND gate 8a. The NAND gate 8a carries out a NAND operation between the pulse output from the pulse generating circuit 7 and the signal shown in FIG. 4C output from a non-inverting terminal Q of the D flip-flop 6, and outputs an output signal shown in FIG. 4F via a terminal 208. On the other hand, the pulse output from the pulse generating circuit 7 is supplied to one input terminal of a NAND gate 8b. The NAND gate 8b carries out a NAND operation between the pulse output from the pulse generating circuit 7 and the signal shown in FIG. 4D output from a inverting terminal /Q (/Q means the inversion of Q) of the D flip-flop 6, and outputs an output signal having logic "H", shown in FIG. 4G, via a terminal 209.

The pulse from the NAND gate 8a is input to an UP terminal of an up/down counter 9 for counting-up by the up/down counter 9. On the other hand, the logic "H" signal from the NAND gate 8b is input to a DOWN terminal of the up/down counter 9, therefore, the up/down counter 9 does not count-down.

In this way, the output of the up/down counter 9 is input to a digital/analog conversion circuit 10 (hereinafter, D/A conversion circuit) to raise the output potential as shown in A point in FIG. 4H. By this potential rise, a delay circuit 14 of the next stage (its operation is described later) operates to increase the delay length. More specifically, as shown in FIG. 3D, in the delay of the delay length control circuit 5, the delay Δ t1 is increased to a delay Δ tc1 after the output potential of the D/A conversion circuit 10 rises as shown at A point in FIG. 4H. By this increase of the delay time, the delay length is adjusted to be Δ tc1+Δ t12=T, so that the total delay length of the delay length control circuit 5 increases, where Δ t12 is a delay in the output circuit 3. Therefore, the data signal output from the output terminal 103 can be synchronized with the falling edge of the reference clock signal.

For example, if the up/down counter 9 uses an 8 bit counter, the count value can be taken from 0 to 255. Assuming that the D/A conversion circuit 10 outputs a direct current potential of 2.5v when the center count value is 128, if the count value becomes larger than the center value 128 due to counting-up, the output voltage value of the D/A conversion circuit 10 rises to a potential of more than 2.5v as shown in FIG. 4H.

The detailed delay circuit 14 shown in FIG. 2 is explained below. The delay circuit of 14 of FIG. 2 includes a P channel transistor 11a having a source electrode connected to a power source and a gate electrode connected to the output terminal 211 of the D/A conversion circuit 10, an N channel transistor 12a having a drain electrode connected to the drain electrode of a transistor 11a via the terminal 212, wherein the drain electrode is connected to the gate electrode. The delay circuit of 14 further includes a P channel transistor 11b having a source electrode connected to the power source and a gate electrode connected to the output terminal 211 of the D/A conversion circuit 10 in the delay control signal generating circuit 20 and an N channel transistor 12b having a gate electrode connected to the drain electrode of the N channel transistor 12a, having a source electrode that is grounded.

The delay circuit 14 of FIG. 2 further includes a P channel transistor 11c having a source electrode connected to the drain electrode of the P channel transistor 11b and a gate electrode connected to an input terminal 203, an N channel transistor 12c having a drain electrode connected to the drain electrode of the P channel transistor 11c and a gate electrode connected to the input terminal 203. The delay circuit 14 further includes a P channel transistor 11d having a source electrode connected to the power source and a drain electrode connected to an output terminal 204, an N channel transistor 12d having a drain electrode connected to the output terminal 204 as well as the drain electrode of the P channel transistor 11d. Drain electrodes of the P channel transistor 11c and the N channel transistor 12c are connected to a capacitor 13, a gate electrode of the P channel transistor 11d and a gate electrode of the N channel transistor 12d via a terminal 213.

The operation of the delay circuit 14 is explained below. As shown in FIG. 2, the output Q from the D flip-flop 1 shown in FIG. 1 is input to the input terminal 203 of the delay circuit 14, and the signal delayed by the delay circuit 14 is output from the output terminal 204. On the other hand, the output potential (the direct current level) from the D/A conversion circuit 10 is supplied to the gate electrodes of the P channel transistors 11a and 11b in the delay circuit 14 as a control signal of the delay circuit 14.

Assuming that the counting-up operation is carried out in the up/down counter 9 and the output potential of the D/A conversion circuit 10 rises as shown in FIG. 4H, the gate voltage at the P channel transistors 11a and 11b in the delay circuit 14 rise, respective on-resistances of the P channel transistors 11a and 11b become high, and the driving ability of the P channel transistors 11a and 11b is decreased. As a result, the current flowing through the P channel transistor 11a decreases and the potential of the junction point 212 between the drain electrode of the P channel transistor 11a and the drain electrode of the N channel transistor 12a falls.

Figure 7:
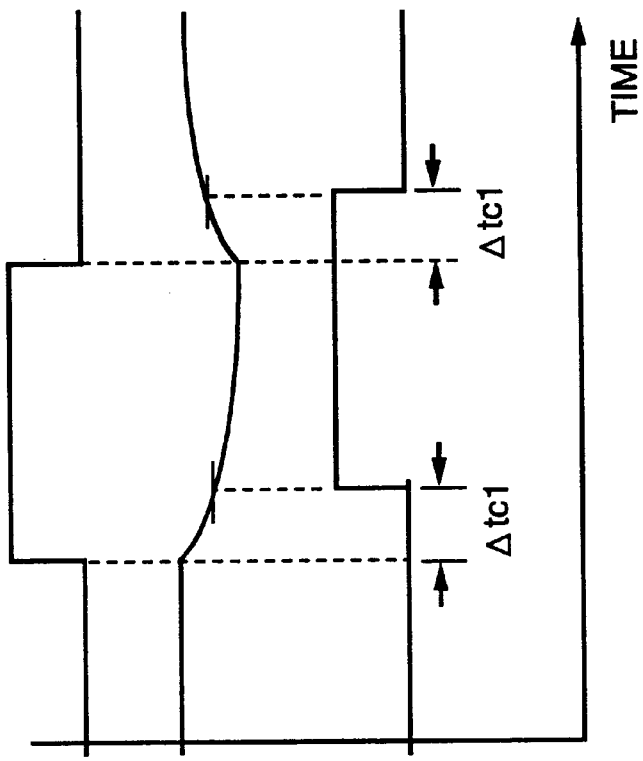
FIGS. 7A–7C are timing charts showing waveforms of an input and an output signal of the delay control circuit when the output data signal is ahead of the reference clock signal.

Upon the fall of the potential of the junction point 212, the on-resistance of the N channel transistor 12b becomes higher. Since the on-resistance of the transistor 11b is also higher, as stated above, the current flowing through the P channel transistor 11c and the N channel transistor 12c becomes small. Accordingly, the charge and discharge current flowing through the capacitor 13 by turning on or off the P channel transistor 11c and the N channel transistor 12c becomes small, and then the time necessary for charge and discharge of the capacitor 13 becomes long as shown in FIGS. 7A–7C described later. On this account, the data signal input from the input terminal 203 is transmitted more slowly to the P channel transistor 11d and the N channel transistor 12d, and, as a result of that, the delay length for transmitting the signal in the delay circuit 14 is increased.

FIGS. 7A–7C are timing charts showing waveforms of the input and the output signals of the delay circuit 14 when the delay output signal voltage of the D/A conversion circuit 10, in other words, the gate voltage of the P channel transistors 11a and 11b is high. In this case, as stated above, since the charge and discharge times of the capacitor 13 are longer, when the input signal shown in FIG. 7A is input, the charge and discharge waveforms at the junction point 213 change slowly as shown in FIG. 7B. Adding the waveforms with slow changes to the gate electrode of the P channel transistor 11d and the gate electrode of the N channel transistor 12d, an output signal having the long delay Δ tc1 is obtained as shown in FIG. 7C.

[when the output data signal is behind the reference clock signal]

The operation of the delay control circuit of FIG. 1 when the output data signal is behind of the reference clock signal is described below. FIGS. 5A–5E are timing charts illustrating the operation of the delay control circuit 100 in FIG. 1 when the output data signal is behind the reference clock signal. FIGS. 6A–6H are timing charts for explaining the operation of the delay length control circuit 5 when the output data signal is behind the reference clock signal.

Figure 5:
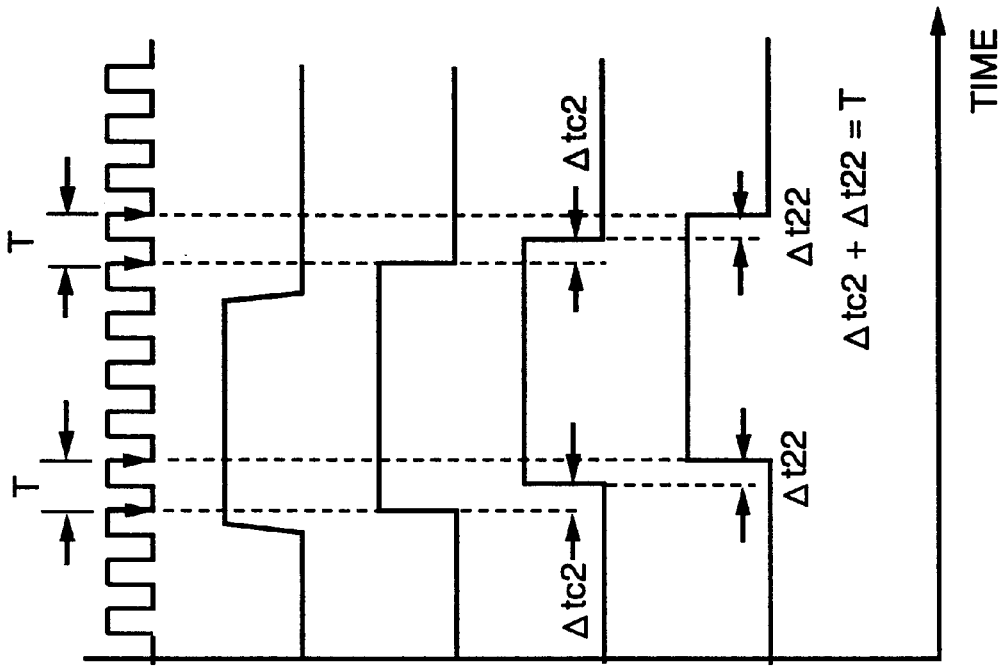
FIGS. 5A–5E are timing charts for explaining the operation of a delay control circuit according to the first embodiment when the output data signal is behind the reference clock signal.
Figure 6:
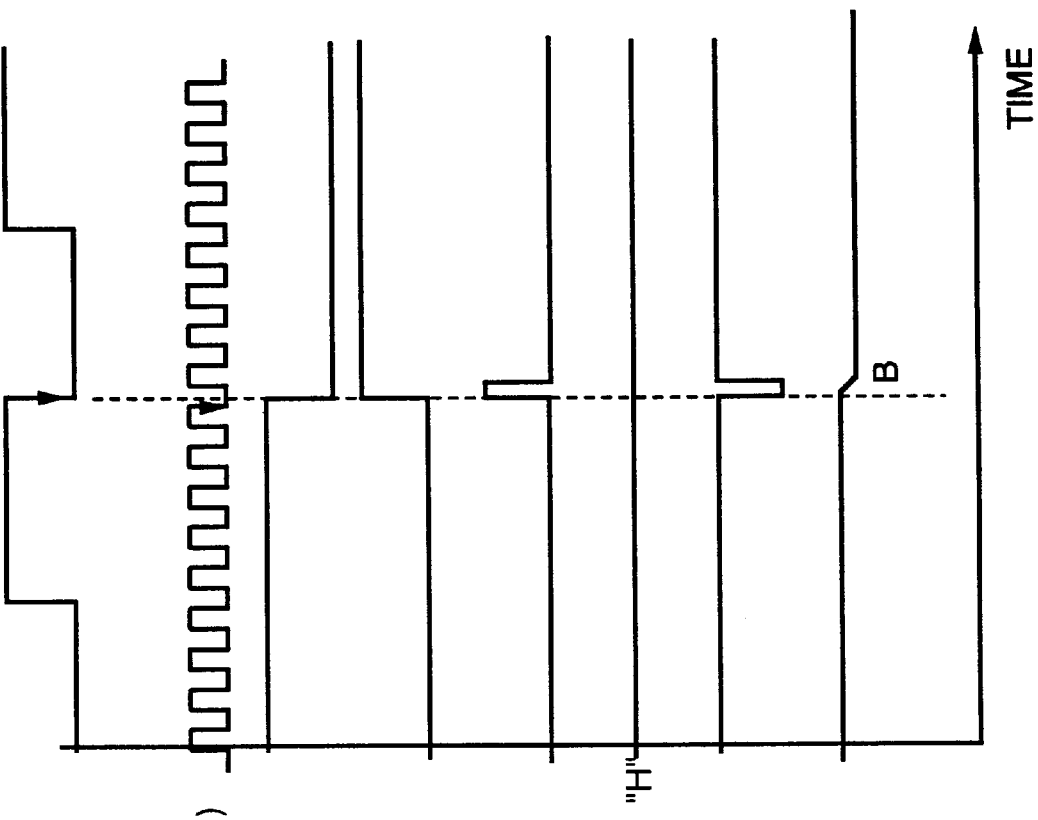
FIGS. 6A–6H are timing charts for explaining the operation of a delay control circuit according to the first embodiment when the output data signal is behind the reference clock signal.
Figure 15:
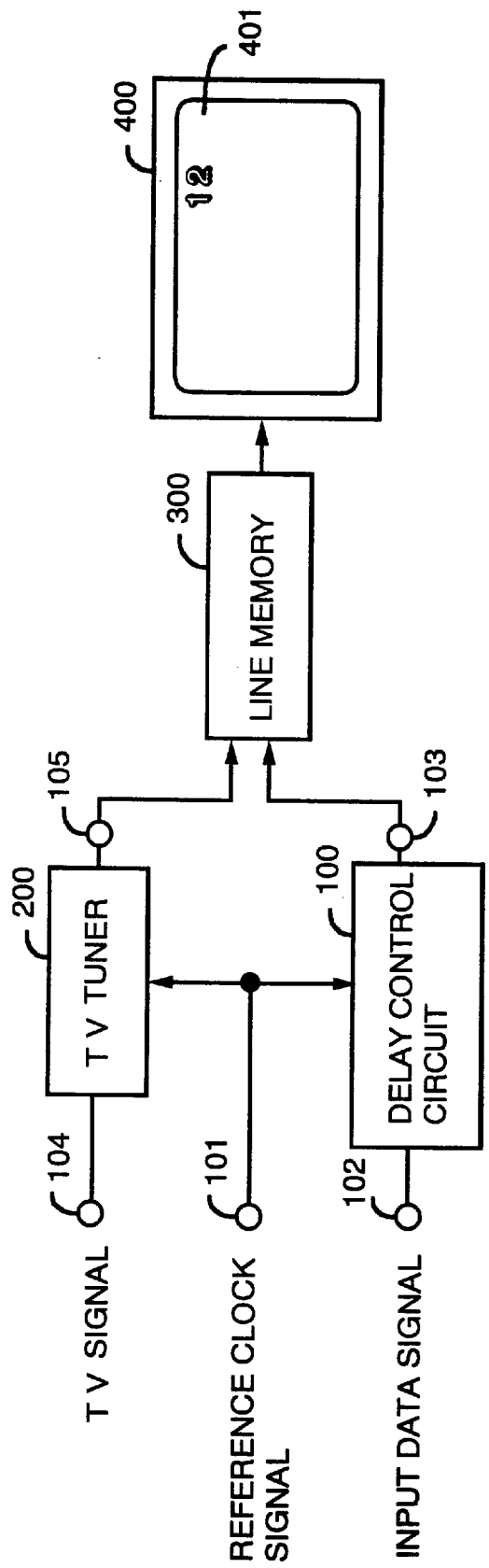
FIG. 15 shows a display system showing a channel indication synchronized with the television picture on a television display.
Figure 16:
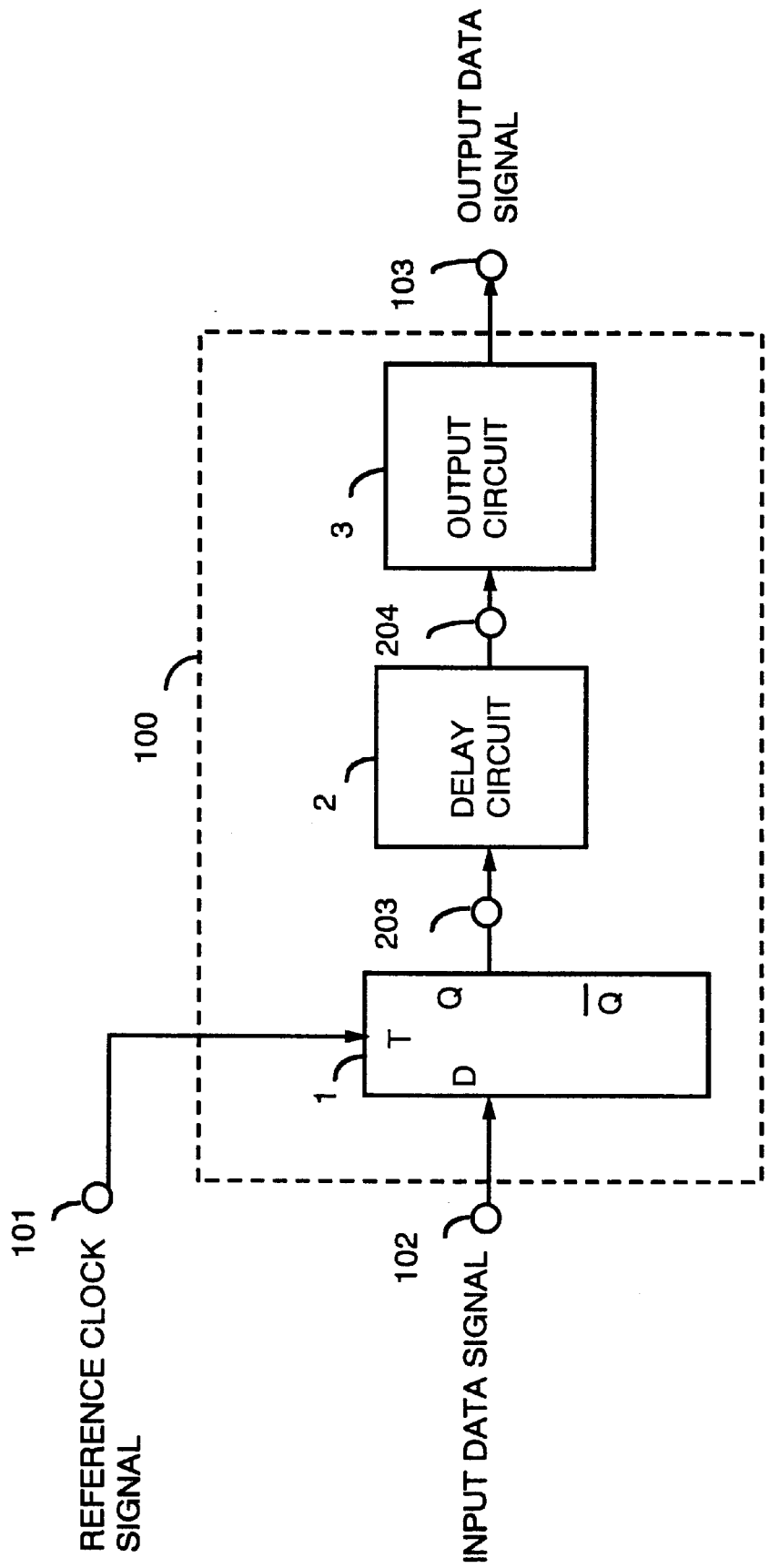
FIG. 16 is a block diagram showing a conventional delay control circuit.
Figure 17:
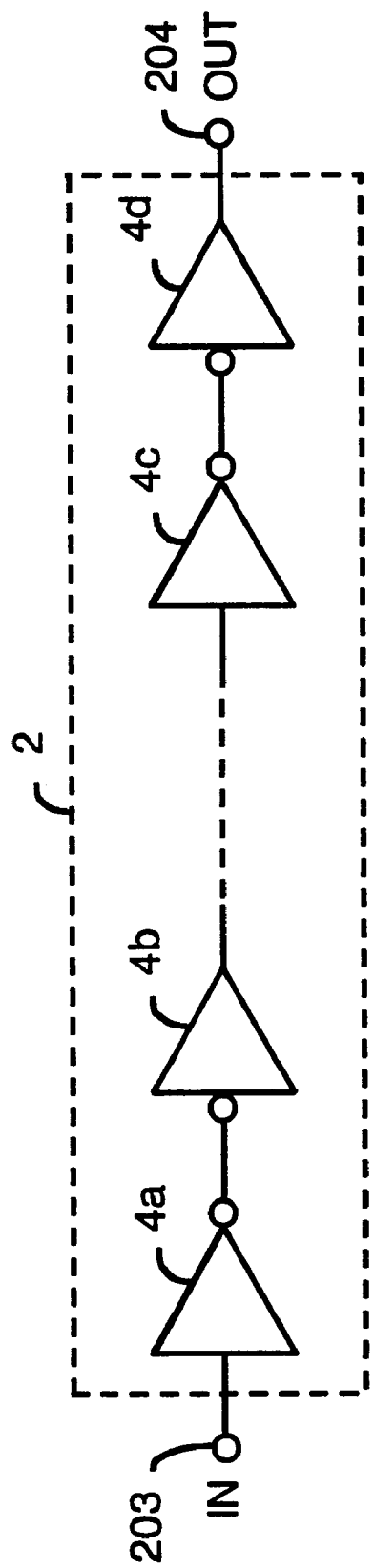
FIG. 17 shows the conventional delay circuit.

The waveforms in FIGS. 5A–5E are different from the waveforms in FIGS. 3A–3E in that the voltage waveforms of the delay control signal shown in FIG. 6H changes towards the direction of the lower voltage level. In this time, the data signal is delayed by Δ tc2 and output to the terminal 204 by the delay control signal at the terminal 211 (later described in detail) generated in the delay control signal generating circuit 20. The data signal at the terminal 204 is delayed by Δ t22 in the output circuit 3 and output to the output terminal 103 of the delay control circuit 100. It is possible that the data signal output from the output terminal 103 is synchronized with the falling edge of the reference clock signal by adjusting the sum of the delays Δ tc2 and Δ t22 to be an integer times as long as the period T of the reference clock signal. The data signal output from the output terminal 103 in the delay control circuit 100 is output to a line memory 300 shown in FIG. 15, is superimposed on the television signal, and is displayed on the monitor 400. The delay Δ t22 means a delay time delayed by the output circuit 3 and it is not possible to adjust that delay time. The delay Δ tc2 means a delay time delayed by the delay length control circuit 5 and is related to a specific feature of the present invention.

FIGS. 6A–6H are timing charts for explaining the generation of a delay control signal when the output data signal is behind the reference clock signal in a delay control signal generating circuit 20 in the delay length control circuit 5. When the falling edge of the output data signal is behind the reference clock signal, the D flip-flop 6 outputs a signal changing from logic "H" to logic "L" at the output terminal Q of the D flip-flop 6 as shown in FIG. 6C. Then a pulse generating circuit 7 outputs a one-shot pulse having a predetermined pulse width as shown in FIG. 6E upon receiving the output data signal via the terminal 202.

The pulse output from the pulse generating circuit 7 is supplied to one input terminal of a NAND gate 8a. The NAND gate 8a carries out a NAND operation between the pulse output from the pulse generating circuit 7 and the signal shown in FIG. 6C output from a non-inverting terminal Q of the D flip-flop 6 and outputs an output signal "H" shown in FIG. 6F via a terminal 208. On the other hand, the pulse output from the pulse generating circuit 7 is supplied to one input terminal of a NAND gate 8b. The NAND gate 8b carries out a NAND operation between the pulse output from the pulse generating circuit 7 and the signal shown in FIG. 6D output from a inverted terminal /Q (/Q means an inversion of Q) of the D flip-flop 6 and outputs an output signal shown in FIG. 6G via a terminal 209.

The logical "H" signal from the NAND gate 8a is input to the UP terminal of the up/down counter 9, but the up/down counter does not count up. On the other hand, the pulse from the NAND gate 8b is input to the DOWN terminal of the up/down counter 9 and the up/down counter 9 counts down.

In this way, the output of the up/down counter 9 is input to the D/A conversion circuit 10 to reduce the output potential shown in B of FIG. 6H. By this reduction in the potential, the delay circuit 14 of the next stage (its operation is described below) operates to decrease the delay length. More concretely, as shown in FIG. 5D, the delay of the delay length control circuit 5, the delay Δ t1, is decreased after the output potential of the D/A conversion circuit 10 falls as shown at B point in FIG. 6H. By this decrease of the delay time, the delay length is adjusted to be Δ tc2+Δ t22=T, where Δ t22 is a delay in the output circuit 3, so the total delay length of the delay length control circuit 5 decreases. Therefore, the data signal output from the output terminal 103 can be synchronized with the falling edge of the reference clock signal.

For example, if the up/down counter 9 uses an 8 bit counter, the count value can be from 0 to 255. Assuming that the D/A conversion circuit 10 outputs a direct current potential of 2.5v when the center count value is 128, if the count value becomes smaller than the center value 128 by the counting-down operation, the output voltage value of the D/A conversion circuit 10 falls to a potential less than 2.5v as shown in FIG. 6H.

The operation of the detailed delay circuit 14 when the output data signal is behind the reference clock signal is explained below. As shown in FIG. 2, the input terminal 203 of the delay circuit 14 receives the output Q from the D flip-flop 1 in FIG. 1 and the signal delayed in the delay circuit 14 is output from the output terminal 204. On the other hand, the output potential (the direct current level) from the D/A conversion circuit 10 is supplied to the gate electrodes of the P channel transistors 11a and 11b in the delay circuit 14 as a control signal of the delay circuit 14.

Assuming that the count-down operation is carried out in the up/down counter 9 and the output potential of the D/A conversion circuit 10 falls as shown in FIG. 6H, the gate voltage at the P channel transistors 11a and 11b in the delay circuit 14 fall, respective on-resistances of the P channel transistors 11a and 11b become low, so the driving ability of the P channel transistors 11a and 11b is increased. As a result, the current flowing through the P channel transistor 11a decreases and the potential of the junction point 212 between the drain electrode of the P channel transistor 11a and the drain electrode of the N channel transistor 12a rises.

Figure 8:
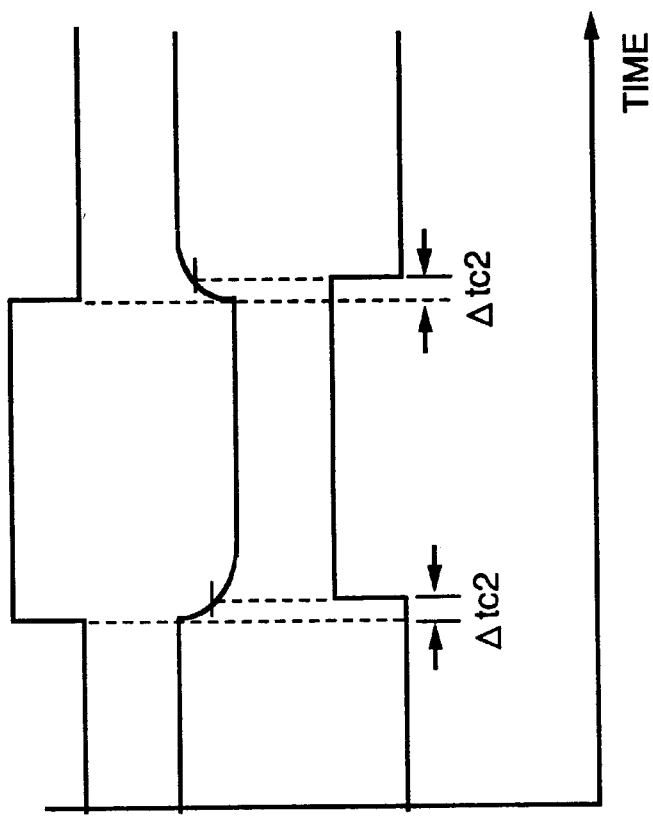
FIGS. 8A–8C are timing charts showing waveforms of the input and the output signal of the delay control circuit when the output data signal is behind the reference clock signal.

Because of the rise of the potential of the junction point 212, the on-resistance of the N channel transistor 12b becomes lower. Since the on-resistance of the transistor 11b is also low, as stated above, the current flowing through the P channel transistor 11c and the N channel transistor 12c becomes large. Accordingly, the charge and discharge current flowing through the capacitor 13 due to turning on and off the P channel transistor 11c and the N channel transistor 12c becomes larger, and then the time necessary for charge and discharge of the capacitor 13 becomes short as shown in FIGS. 8A–8C, described later. On this account, the data signal input from the input terminal 203 is transmitted earlier to the P channel transistor 11d and the N channel transistor 12d, and, as a result, the delay in transmission of the signal in the delay circuit 14 is decreased.

FIGS. 8A–8C are timing charts showing waveforms of the input and the output signal of the delay circuit 14 when the gate voltage of the P channel transistors 11a and 11b is lower. In this case, as stated above, since the charge and discharge time of the capacitor 13 is shorter, when the input signal shown in FIG. 8A is input, the charge and discharge waveforms at the junction point 213 changes quickly as shown in FIG. 8B. Adding the waveforms with slow changes to the gate electrode of the P channel transistor 11d and the gate electrode of the N channel transistor 12d, an output signal having the short delay Δ tc2 is obtained as shown in FIG. 8C.

In this way, in the delay circuit 14, when the output potential from the D/A conversion circuit 10 becomes higher, the delay of the delay circuit becomes longer; when the output potential becomes lower, the delay becomes shorter. In other words, the output voltage of the D/A conversion circuit 10 functions as a control signal for controlling the delay in the delay circuit 14.

As described above, according to the first embodiment of the present invention, the input data signal latched by the reference clock signal is input as an input signal, for controlling increasing and decreasing of the delay length of the delay circuit with the direct current level signal generated according to the reference clock signal and the output signal from the output circuit. Therefore, even if there are some variations of the source voltage or the temperature of the external environment, the changing points of the reference clock signal and the output data signal can be so controlled so that they have the same timing.

In particular, when the delay control circuit of the first embodiment of the present invention is used in the display control unit of flat panels such as liquid crystal panels, plasma display panels (PDP), or thin film transistors (TFT), it becomes easier to synchronize the timing for storing the picture signal to be displayed in the line memory with the system clock signal of the flat panel. Further, it is possible to prevent dot shift on the monitor 400 due to a delay of the data output to the line memory by adjusting the delay in the delay control circuit.

Embodiment 2

Figure 9:
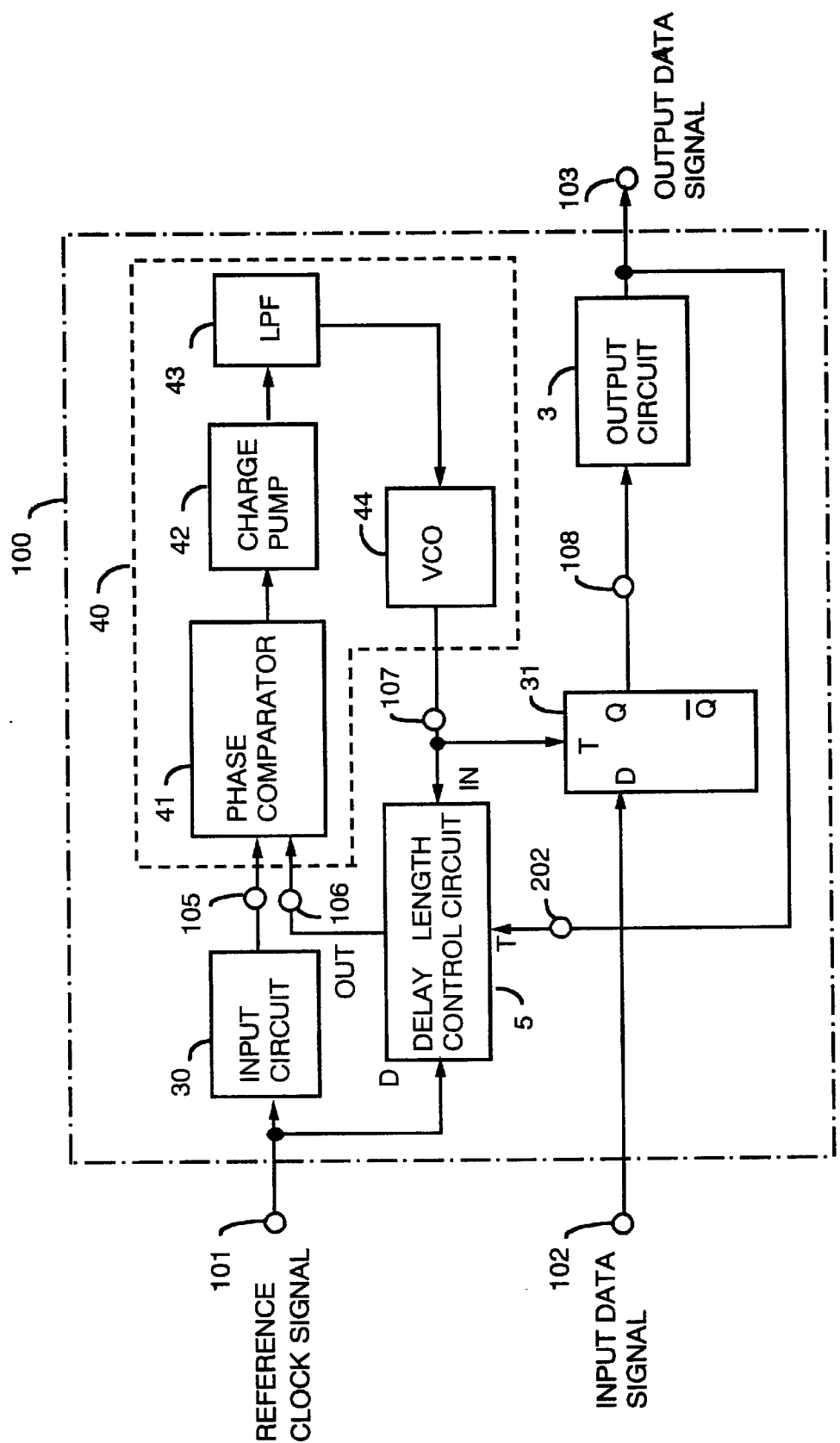
FIG. 9 is a block diagram showing a delay control circuit of a second embodiment of the present invention.

A second embodiment of the present invention is explained using the drawings. FIG. 9 is a block diagram showing a delay control circuit of the second embodiment of the present invention. The delay control circuit of FIG. 9 includes an input circuit 30 which receives the reference clock signal and a delay length control circuit 5 for controlling the delay of the input signal. The delay length control circuit 5 of the second embodiment is partly different from the delay length control circuit 5 of the first embodiment. The delay control circuit 100 of FIG. 9 further includes a phase locked loop circuit 40 (hereinafter referred to a PLL circuit) for comparing the phase of the output signal from the input circuit 30 and the phase of the output signal from the delay length control circuit 5, a latch circuit 31 (comprised of D flip-flop) for temporarily storing the data signal input to the data signal input terminal 102, and an output circuit 3 for delaying the data signal stored in the latch circuit 31.

In the delay length control circuit 5 shown in FIG. 9, the reference clock signal is input to the input circuit 30 via the input terminal 101, and the output signal delayed in the input circuit 30 and the output signal from the delay length control circuit 5 are input to a phase comparator 41 in the PLL circuit 40. The phase comparator 41 compares the phases of these two signals and synchronizes the phase of the signal at the output terminal 105 of the input circuit 30 with the phase of the signal at the output terminal 106 of the delay length control circuit 5. The phase difference detected by this phase comparator 41 is input to a charge pump circuit 42. If the phase of the reference clock signal from the input circuit 30 is ahead of the phase of the output signal from the delay length control circuit 5, the capacitor in the charge pump circuit 42 is charged. If the phase of the reference clock signal from the input circuit 30 is behind the phase of the output signal from the delay length control circuit 5, the capacitor in the charge pump circuit 42 is discharged. The output from the charge pump circuit 42 is input to a voltage controlled oscillating circuit (hereinafter referred to as a VCO) 44 as a control voltage, proportional to the phase difference, via a lowpass filter (LPF) 43.

The VCO 44 changes output frequency according to the input control voltage. For example, if the frequency of the reference clock signal described above is higher than the frequency of the output signal from the delay length control circuit 5, in other words, if the output voltage of the lowpass filter 43 is higher, the VCO 44 raises the frequency of its output signal. If the frequency of the reference clock signal is lower, in other words, if the output voltage of the lowpass filter 43 is lower, the VCO 44 operates to lower the frequency of the output signal of the VCO 44.

Figure 10:
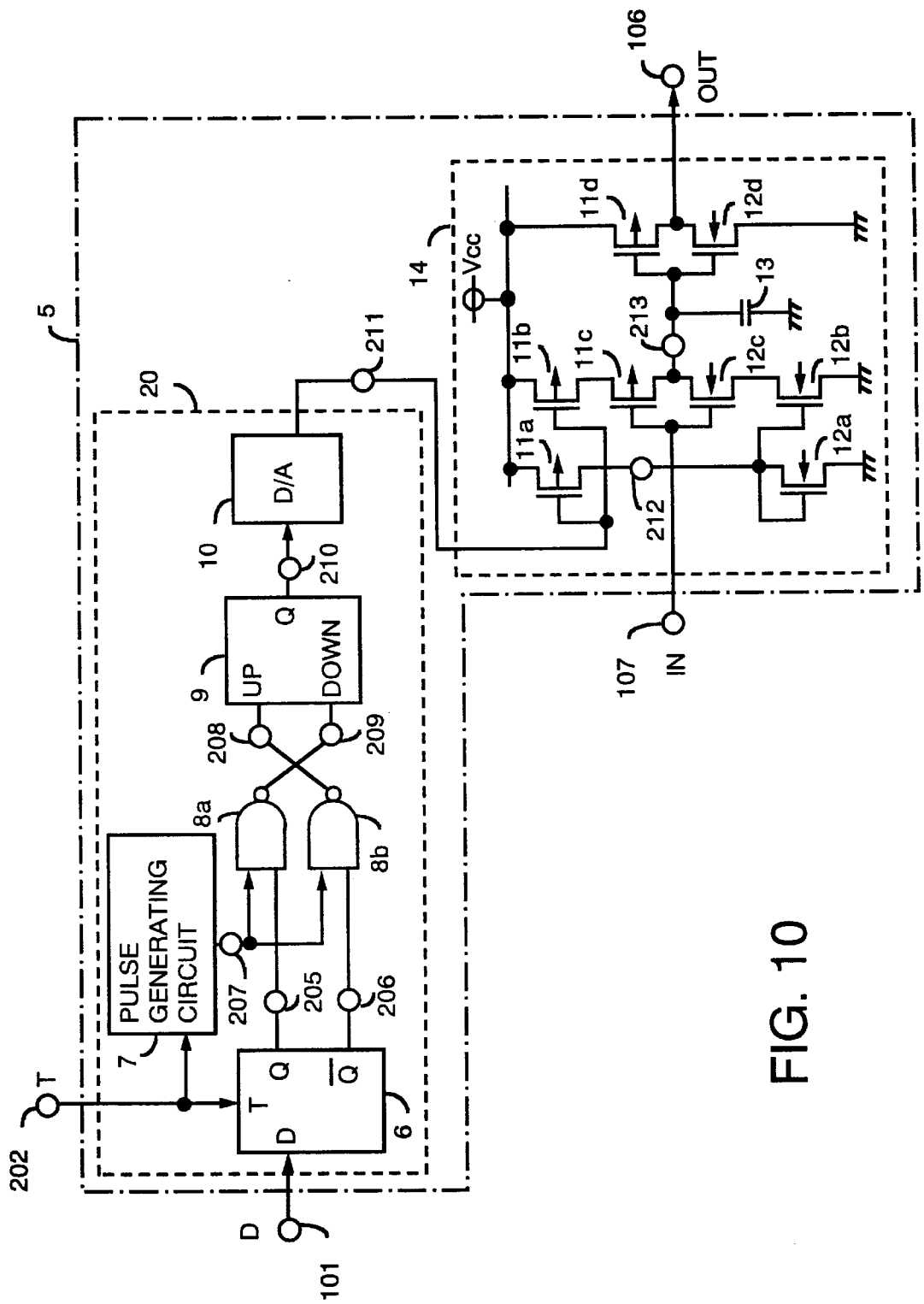
FIG. 10 is a block diagram showing a detailed delay control circuit of the second embodiment.

The construction of the delay length control circuit 5 is described below. FIG. 10 shows a delay length control circuit 5 of the second embodiment. In FIG. 10, the output terminal of the NAND gate 8a is connected to the input terminal 209 of the up/down counter 9. On the other hand, the output terminal of the NAND gate 8b is connected to the input terminal 208 of the up/down counter 9. The delay length control circuit 5 of the second embodiment is different only in this point from the delay length control circuit 5 of the first embodiment. Accordingly, the detailed description of the construction of the delay length control circuit 5 of the second embodiment is omitted.

The delay length control circuit 5 of the second embodiment of the present invention latches the reference clock signal input to a terminal 101 in response to an output signal received from the output circuit 3 via the terminal T 202. Then, the latched signal is delayed and output to the terminal 106. The delay control circuit 100 of the second embodiment has a specific feature in that the output data signal at the terminal 103 is synchronized with the reference clock signal by supplying the output of the PLL 40 to the latch circuit 31 which latches the data signal from the terminal 102. As stated above, the delay length control circuit 5 carries out the same delay operation as that of the first embodiment except for the partial connection difference. In other words, the delay length control circuit 5 outputs a delay control signal at the terminal 211 of the delay control signal generating circuit 20 by latching the reference clock signal input to the terminal 101 in response to the output signal 103 of the output circuit 3. The reference clock signal at the terminal 107 output from the VCO 44 is delayed by the delay control signal at the terminal 211 and supplied to the phase comparator 41 via the terminal 106. The phase of the signal at the terminal 106 from the delay length control circuit 5 is compared with the phase of the delay signal at the terminal 105, which is delayed by Δ t0 in the input circuit 30, and by the phase comparator 41 to increase or decrease the frequency of the reference clock signal output from the VCO 44. In the latch circuit 31, the data signal input from the data signal input terminal 102 is latched in response to the reference clock signal at the terminal 107 from the VCO 44 and then a constant delay is given by the output circuit 3 before being output from the terminal 103.

In other words, in the second embodiment of the present invention, the delay length control circuit 5 shown in FIG. 2 is arranged between the VCO 44 and the phase comparator 41. Accordingly, the phase comparator 41 synchronizes the phase of the output of the delay length control circuit 5 with the phase of the output from the input circuit 30. As a result, the output data signal of the delay control circuit 100 is synchronized with the reference clock signal.

[when the output data signal is ahead of the reference clock signal]

Figure 11:
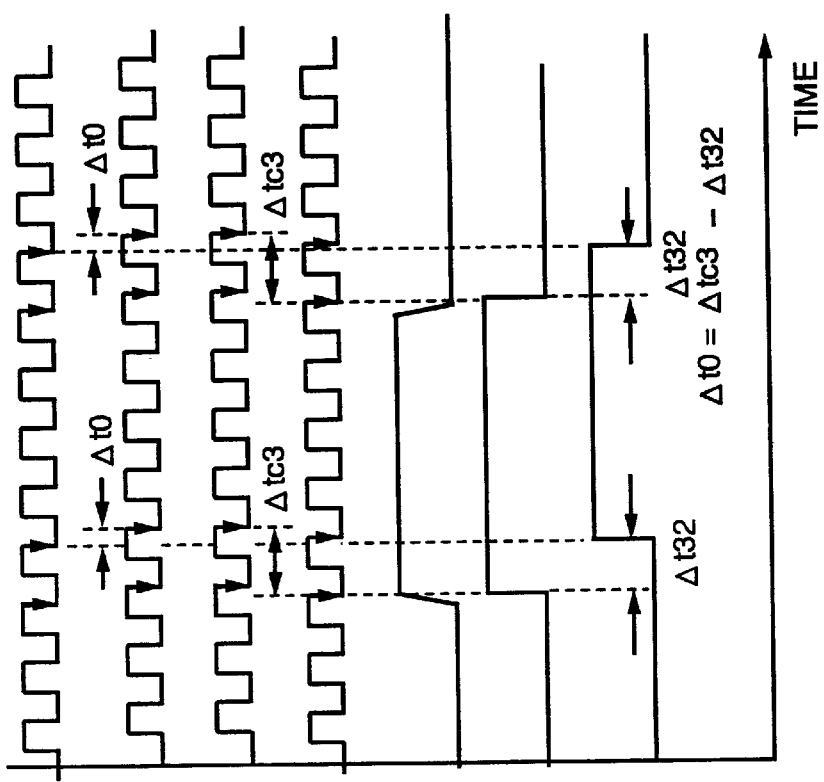
FIGS. 11A–11G are timing charts for explaining the operation of the delay control circuit according to the second embodiment when the output data signal is ahead of the reference clock signal.

The operation of the delay length control circuit of FIG. 9 when the output data signal is ahead of the reference clock signal is described below. The reference clock signal input via the input terminal 101 of the delay control circuit 100 is latched in response to the output data signal input to the terminal 202, so the signal shown in FIG. 11C is output at the terminal 106. The clock signal at the terminal 107 from the VCO 44 is delayed by Δ tc3 in response to the delay control signal at the terminal 211 generated in the delay length control circuit 5 (described later) and is output to the terminal 106. Accordingly, the output clock signal at the terminal 107 from the Vco 44 is ahead of the output clock signal at the terminal 106 by Δ tc3. At the latch circuit 31, the data signal input to the terminal 102 is latched in response to the output clock signal at the terminal 107 from the VCO 44 and is output to the terminal 108. The data signal at the terminal 108 is delayed by Δ t32 in the output circuit 3 and is output to the terminal 103 of the delay control circuit 100. It is possible that the data signal output from the output terminal 103 is synchronized with the falling edge of the reference clock signal by adjusting so that Δ t0−Δ tc3+Δ t32=0. The data signal output from the output terminal 103 in the delay control circuit 100 is output to the line memory 300 shown in FIG. 15 and is superimposed on the television signal and displayed on the monitor 400. The delay Δ t32 means a delay time of the output circuit 3 and it is not possible to adjust that delay time. The delay Δ tc3 means a delay time of the delay length control circuit 5 and is related to a specific feature of the present invention.

The operation of the delay length control circuit 5 in the control circuit 100 of the second embodiment of the present invention is described below. The delay length control circuit 5 of FIG. 10 includes an input terminal 101 where the reference clock signal shown in FIG. 11A is input, an input terminal 202 where the output data signal (FIG. 11G) from the output circuit 3 is input, a terminal 107 where the reference clock signal from the VCO 44 is input and an output terminal 108 where the data signal is output from the latch circuit 31. In the delay length control circuit 5 of FIG. 10, a D terminal 101 of a D flip-flop 6 receives the reference clock signal (FIG. 11A) and a terminal T 202 receives the output data signal (FIG. 11G) of the output circuit 3. The D flip-flop 6 latches the reference clock signal input from the terminal 101 at the falling edge of the output signal input to the terminal T 202 as described below.

Figure 12:
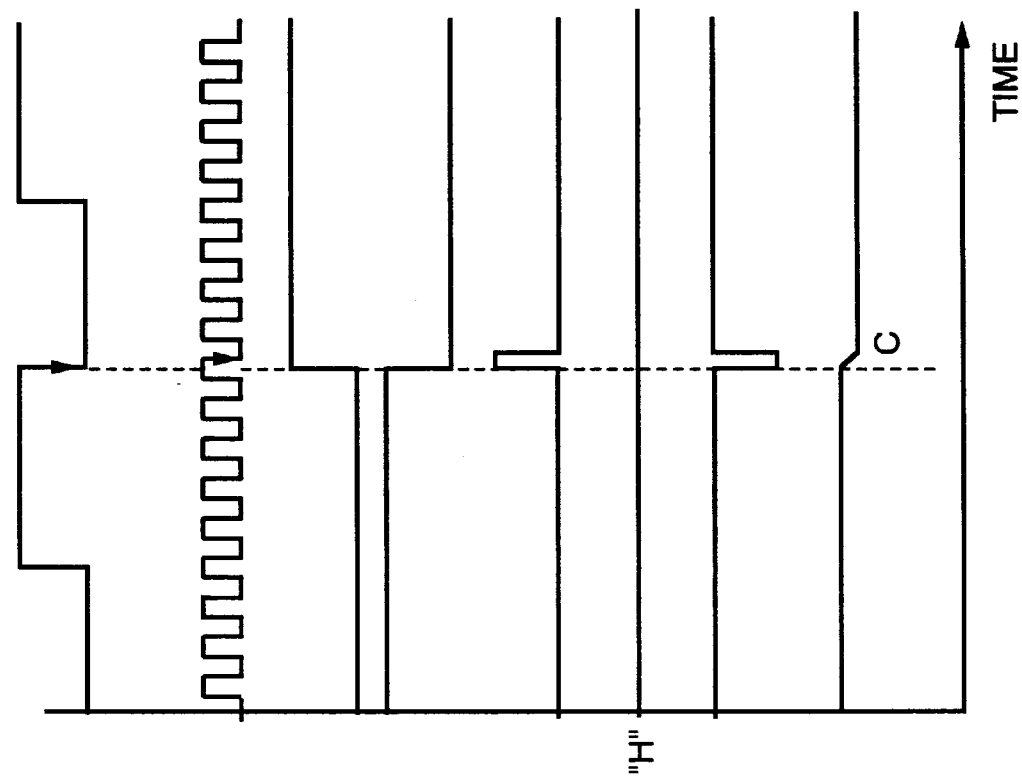
FIGS. 12A–12H are timing charts for explaining the operation of the delay control circuit according to the second embodiment when the output data signal is ahead of the reference clock signal.
Figure 13:
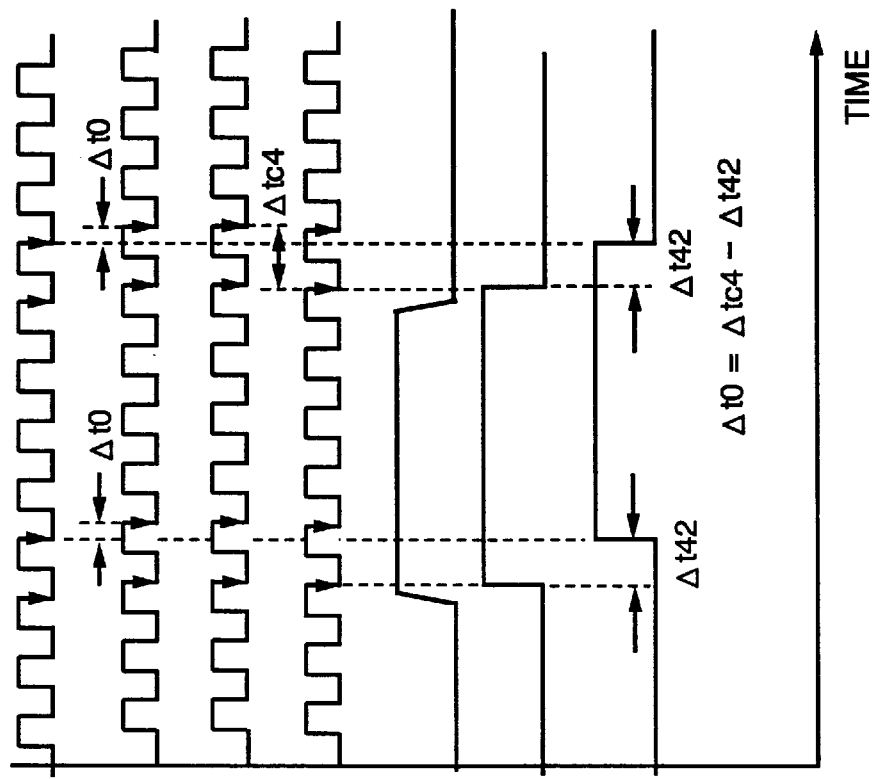
FIGS. 13A–13G are timing charts to explain the operation of the delay control circuit according to the second embodiment when the output data signal is behind the reference clock signal.

FIGS. 12A–12H are timing charts for explaining the generation of a delay control signal when the output data signal is ahead of the reference clock signal in the delay control signal generating circuit 20 in the delay length control circuit 5. When the falling edge of the output data signal is ahead of the reference clock signal, the D flip-flop 6 outputs the signal changing from logic "L" to logic "H" at the output terminal Q of the D flip-flop 6 as shown in FIG. 12C. Then a pulse generating circuit 7 outputs a one-shot pulse having a predetermined pulse width as shown in FIG. 12E upon receiving the output data signal via the terminal 202.

The pulse output from the pulse generating circuit 7 is supplied to one input terminal of a NAND gate 8a. The NAND gate 8a carries out a NAND operation between the pulse output from the pulse generating circuit 7 and the signal shown in FIG. 12C output from a non-inverting terminal Q of the D flip-flop 6 and outputs an output signal shown in FIG. 12G via a terminal 209. On the other hand, the pulse output from the pulse generating circuit 7 is supplied to one input terminal of a NAND gate 8b. The NAND gate 8b carries out a NAND operation between the pulse output from the pulse generating circuit 7 and the signal shown in FIG. 12D output from a inverted terminal /Q (/Q means an inversion of Q) of the D flip-flop 6 to output an output signal having logic "H" shown in FIG. 12F via a terminal 208.

The pulse from the NAND gate 8a is input to a DOWN terminal of an up/down counter 9 to count-down the counter of the up/down counter 9. On the other hand, the logic "H" signal from the NAND gate 8b is input to an UP terminal of the up/down counter 9. Therefore, the counter of the up/down counter 9 does not count up.

In this way, the output of the up/down counter 9 is input to a digital/analog conversion circuit 10 to reduce the output potential as shown by A point in FIG. 12H. Because of this reduction in potential, a delay circuit 14 of the next stage (its operation is described below) decreases the delay.

For example, if the up/down counter 9 uses an 8 bit counter, the count value can be taken from 0 to 255. Assuming that the D/A conversion circuit 10 outputs a direct current potential of 2.5v when the central count value is 128, if the count value becomes smaller than the center value 128 due to the count-down operation, the output voltage value of the D/A conversion circuit 10 falls to a potential less than 2.5v as shown in FIG. 12H.

The detailed delay circuit 14 shown in FIG. 10 is omitted, since the circuit construction is as same as that in the delay circuit 14 in FIG. 2. The operation of the delay circuit 14 in FIG. 10 is also the same as that of the delay circuit 14 in FIG. 2. That is, the count-up or count-down operation is carried out in the up/down counter 9. When the output potential of the D/A conversion circuit 10 becomes lower as shown in FIG. 12H, the delay length in the delay circuit 14 becomes shorter, and when the output potential of the D/A conversion circuit 10 becomes higher as shown in FIG. 14H, the delay length in the delay circuit 14 becomes longer.

[when the output data signal is behind of the reference clock signal]

The operation of the delay control circuit of FIG. 9 when the output data signal is behind the reference clock signal is described below. FIGS. 13A–13G are timing charts illustrating the operation of the delay control circuit 100 in FIG. 9 when the output data signal is behind the reference clock signal. FIGS. 14A–14H are timing charts for the operation of the delay length control circuit 5 when the output data signal is behind the reference clock signal.

Figure 14:
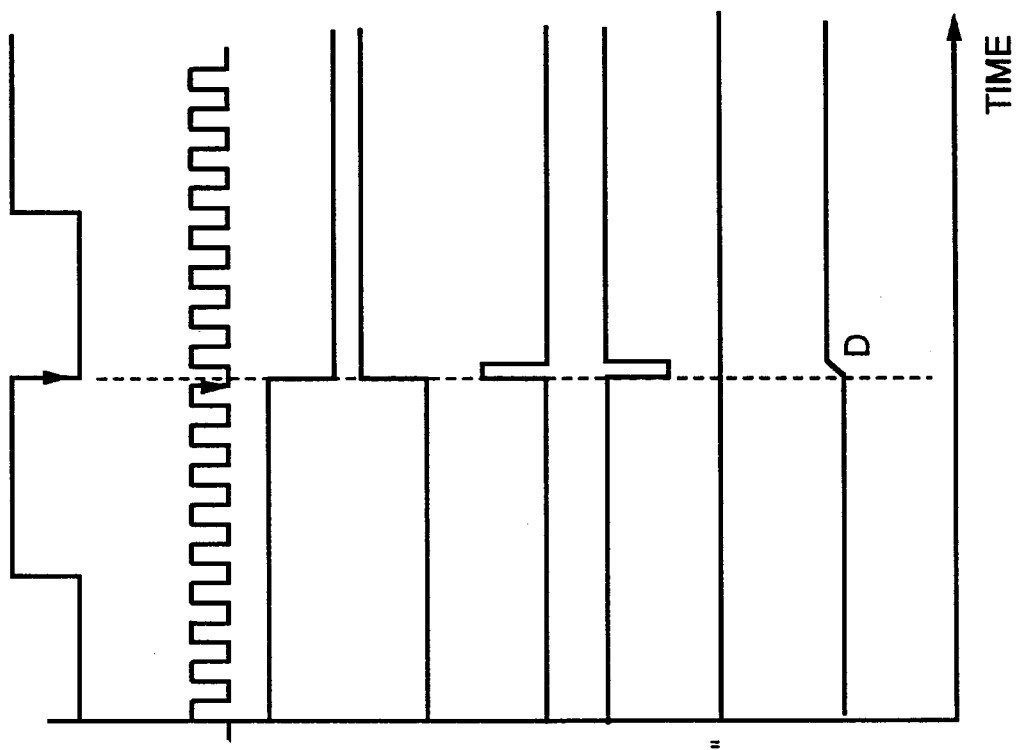
FIGS. 14A–14H are timing charts for explaining the operation of the delay control circuit according to the second embodiment when the output data signal is behind the reference clock signal.

The waveforms in FIGS. 13A–13G are different from the waveforms in FIGS. 11A–11G in that the voltage waveforms of the delay control signal shown in FIG. 14H changes in the direction of a higher voltage level. In this time, the data signal is delayed by Δ tc4 and output to the terminal 106 by the delay control signal at the terminal 211 (later described in detail) generated in the delay control signal generating circuit 20. The data signal input to the terminal 102 is latched by the latch circuit 31 in response to the output clock signal at the terminal 107 output from the VCO 44 is output to the terminal 108. The data signal at the terminal 108 is delayed by Δ t42 in the output circuit 3 and output to the output terminal 103 of the delay control circuit 100. That the data signal output from the output terminal 103 is synchronized with the falling edge of the reference clock signal by adjusting the sum of the delay Δ tc4 and Δ t42 to be Δ t0=Δ tc4−Δ t42. The data signal output from the output terminal 103 in the delay control circuit 100 is output to a line memory 300 shown in FIG. 15 and is superimposed on the television signal and displayed on the monitor 400. The delay Δ t42 means a delay time delayed by the output circuit 3 and it is not possible to adjust that delay time. The delay Δ tc4 means a delay time delayed by the delay length control circuit 5 and is related to a specific feature of the present invention.

FIGS. 14A–14H are timing charts for explaining the generation of a delay control signal when the output data signal is behind the reference clock signal in a delay control signal generating circuit 20 in the delay length control circuit 5. When the falling edge of the output data signal is behind the reference clock signal, the D flip-flop 6 outputs a signal changing from logic "H" to logic "L" at the output terminal Q of the D flip-flop 6 as shown in FIG. 14C. Then a pulse generating circuit 7 outputs a one-shot pulse having a predetermined pulse width as shown in FIG. 14E upon receiving the output data signal via the terminal 202.

The pulse output from the pulse generating circuit 7 is supplied to one input terminal of a NAND gate 8a. The NAND gate 8a carries out a NAND operation between the pulse output from the pulse generating circuit 7 and the signal shown in FIG. 14C output from a non-inverting terminal Q of the D flip-flop 6 and outputs an output signal "H" shown in FIG. 14G via a terminal 209. On the other hand, the pulse output from the pulse generating circuit 7 is supplied to one input terminal of a NAND gate 8b. The NAND gate 8b carries out a NAND operation between the pulse output from the pulse generating circuit 7 and the signal shown in FIG. 14D output from a inverting terminal /Q of the D flip-flop 6 and outputs an output signal shown in FIG. 14F via a terminal 208.

The logical "H" signal from the NAND gate 8a is input to the DOWN terminal of the up/down counter 9, but the counter of the up/down counter does not count down. On the other hand, the pulse from the NAND gate 8b is input to the UP terminal of the up/down counter 9 and the counter of the up/down counter 9 counts up.

In this way, the output of the up/down counter 9 is input to the D/A conversion circuit 10 to raise the output potential shown in D of FIG. 14H. By this potential rise, the delay circuit 14 of the next stage (its operation is described after) increases the delay length.

For example, if the up/down counter 9 uses an 8 bit counter, the count value can be taken from 0 to 255. Assuming that the D/A conversion circuit 10 outputs a direct current potential 2.5v when the center count value is 128, if the count value becomes larger than the center value 128 by counting up, the output voltage value of the D/A conversion circuit 10 rises to a potential larger than 2.5v as shown in FIG. 14H.

As described above, according to the second embodiment of the present invention, the delay length control circuit 5 is arranged in the PLL circuit and the phase of the output clock of the VCO 44 is arranged to be ahead of the output phase of the delay length control circuit 5. By latching the input data signal input to the terminal D of the latch circuit 31 in response to the output clock of the VCO 44, it is possible to synchronize the output data signal with the reference clock signal.

In particular, when the delay control circuit of the second embodiment of the present invention is used as the display control unit of a flat panel such as a liquid crystal panel, a plasma display (PDP) panel, and a thin film transistor (TFT), it becomes easier to synchronize the timing for storing the picture signal to be displayed in the line memory with the system clock signal of the flat panel. Further, it is possible to prevent dot shift on the monitor 400 due to the delay of the data output to the line memory by adjusting the delay in the delay control circuit.

As described above, according to the second embodiment of the present invention, even if the period of the reference clock signal varies or external factors, such as the source voltage or the ambient temperature vary, it is possible to synchronize the output data signal with the reference clock signal.

In the delay length control circuits 5 of the first and second embodiment, the operation synchronized with the falling edge of the reference clock signal is explained, however, it is not limited to this description. It is also possible for the delay length control circuit 5 to be synchronized with the rising edge of the reference clock signal.

What is claimed is:

1. A delay control circuit for synchronizing a data signal input with a reference clock signal comprising:

first holding means for holding a data signal in response to a change in a reference clock signal;

a delay length control circuit for delaying the data signal received from the first holding means; and an output circuit for delaying an output signal of the delay length control circuit to synchronize the data signal with the reference clock signal wherein the data signal input to the delay length control circuit is delayed by the delay length control circuit in response to the reference clock signal and a delayed data signal fed back from an output terminal of the output circuit to the delay length control circuit, the delay control signal generating circuit comprising a delay control signal generating circuit for generating a delay control signal in response to the reference clock signal and the delayed data signal, the delay control signal generating circuit comprising second holding means for holding the reference clock signal in response to the delayed data signal;

a pulse generating circuit for generating a pulse in response to the delayed data signal;

first operating means for carrying out a NAND operation between a pulse from the pulse generating circuit and a non-inverted output signal of the second holding means;

second operating means for carrying out a NAND operation between a pulse from the pulse generating circuit and an inverted output signal from the second holding means;

a counter for counting output signals from the first and second operating means; and a convertor for converting an output of the counter into a direct current signal; and delay means for delaying the input data signal held in the first holding means in response to the delay control signal.

2. The delay control circuit according to claim 1 wherein the counter counts up in response to an output signal from the first operating means and counts down in response to an output signal from the second operating means.

3. A delay control circuit for synchronizing a data signal input with a reference clock signal comprising:

first holding means for holding a data signal in response to a change in a reference clock signal;

a delay length control circuit for delaying the data signal received from the first holding means; and an output circuit for delaying an output signal of the delay length control circuit to synchronize the data signal with the reference clock signal wherein the data signal input to the delay length control circuit is delayed by the delay length control circuit in response to the reference clock signal and a delayed data signal fed back from an output terminal of the output circuit to the delay length control circuit, the delay length control circuit comprising a delay control signal generating circuit for generating a delay control signal in response to the reference clock signal and the delayed data signal; and delay means for delaying the input data signal held in the first holding means in response to the delay control signal, the delay means comprising a first active element changing dynamic resistance in response to the delay control signal;

a second active element for charging and discharging a capacitor in response to an output signal from the first holding means; and a third active element turning on and off in response to a voltage produced by charge on the capacitor to produce a delayed output signal.

4. The delay control circuit according to claim 3 wherein the first, second, and third active elements comprise P channel transistors and N channel transistors.

5. A delay control circuit for synchronizing a data signal input with a reference clock signal comprising:

first holding means for holding a data signal in response to a change in a reference clock signal, the first holding means comprising a D flip-flop;

a delay length control circuit for delaying the data signal received from the first holding means; and an output circuit for delaying an output signal of the delay length control circuit to synchronize the data signal with the reference clock signal wherein the data signal input to the delay length control circuit is delayed by the delay length control circuit in response to the reference clock signal and a delayed data signal fed back from an output terminal of the output circuit to the delay length control circuit.

6. The delay control circuit according to claim 1, wherein the second holding means is a D flip-flop.

7. A delay control circuit for synchronizing a data signal input with a reference clock signal comprising:

first holding means for holding a data signal in response to a change in a reference clock signal;

a delay length control circuit for delaying the data signal received from the first holding means;

an output circuit for delaying an output signal of the delay length control circuit to synchronize the data signal with the reference clock signal wherein the data signal input to the delay length control circuit is delayed by the delay length control circuit in response to the reference clock signal and a delayed data signal fed back from an output terminal of the output circuit to the delay length control circuit, the delay length control circuit comprising a delay control signal generating circuit for generating a delay control signal in response to the reference clock signal and the delayed data signal, the delay control signal generating circuit comprising a D flip-flop having a first terminal T receiving the data signal, a second terminal D receiving the reference clock signal, a non-inverting terminal Q outputting the reference clock signal latched in response to the delayed data signal from the output circuit, and an inverting terminal $\overline{Q}$ outputting an inverted signal from the signal output from the non-inverting terminal Q, a one-shot pulse generator for generating a pulse in response to the delayed data signal from the output circuit, a first NAND operating circuit for carrying out a NAND operation between the pulse generated by the one-shot pulse generator and the signal output signal from the terminal Q of the D flip-flop, a second NAND operating circuit for carrying out a NAND operation between the pulse generated by the one-shot pulse generator and signal output from the terminal $\overline{Q}$ of the D flip-flop, a counter for counting up an output signal from the first NAND operating circuit and counting down an output signal from the second NAND operating circuit, and a digital-to-analog conversion circuit for converting the output of the counter to the direct current delay control signal.

8. A delay control circuit for synchronizing a data signal input with a reference clock signal comprising:

first holding means for holding a data signal in response to a change in a reference clock signal;

a delay length control circuit for delaying the data signal received from the first holding means;

an output circuit for delaying an output signal of the delay length control circuit to synchronize the data signal with the reference clock signal wherein the data signal input to the delay length control circuit is delayed by the delay length control circuit in response to the reference clock signal and a delayed data signal fed back from an output terminal of the output circuit to the delay length control circuit, the delay length control circuit comprising a delay control signal generating circuit for generating a delay control signal in response to the reference clock signal and the delayed data signal; and delay means for delaying the input data signal held in the first holding means in response to the delay control signal, the delay means comprising a first P channel transistor having a gate electrode connected to an output terminal of the delay control signal generating circuit, a source electrode connected to a power source, and a drain electrode;

a first N channel transistor having a gate electrode and a drain electrode connected to the drain electrode of the first P channel transistor; and a source electrode connected to ground;

a second P channel transistor having a gate electrode connected to the output terminal of the delay control signal generating circuit, a source electrode connected to the power source, and a drain electrode;

a second N channel transistor having a gate electrode connected to the drain electrode of the first N channel transistor, a source electrode connected to the ground, and a drain electrode;

a third P channel transistor having a gate electrode connected to a non-inverting terminal of the first holding means, a source electrode connected to the drain electrode of the second P channel transistor, and a drain electrode;

a third N channel transistor having a gate electrode connected to a non-inverting terminal of the first holding means, a source electrode connected to the drain electrode of the second N channel transistor, and a drain electrode;

a capacitor having a first end connected to the drain electrodes of the third P channel transistor and the third N channel transistor and a second end connected to the ground;

a fourth P channel transistor having a gate electrode connected to the first end of the capacitor, a source electrode connected to the power source, and a drain electrode; and a fourth N channel transistor having a gate electrode connected to the first end of the capacitor, a source electrode connected to the ground, and a drain electrode, wherein the drain electrode of the fourth P channel transistor and the drain electrode of the fourth N channel transistor are connected to an output terminal of the delay length control circuit.

9. A delay control circuit for synchronizing a data signal input with a reference clock signal comprising:

first holding means for holding a data signal in response to a change in a reference clock signal;

a delay length control circuit for delaying the data signal received from the first holding means;

an output circuit for delaying an output signal of the delay length control circuit to synchronize the data signal with the reference clock signal wherein the data signal input to the delay length control circuit is delayed by the delay length control circuit in response to the reference clock signal and a delayed data signal fed back from an output terminal of the output circuit to the delay length control circuit, the delay Length control circuit comprising a delay control signal generating circuit for generating a delay control signal in response to the reference clock signal and the delayed data signal, the delay control signal generating circuit comprising delay means for delaying the input data signal held in the first holding means in response to the delay control signal; and a phase locked loop including a phase comparator and a voltage control circuit (VCO).

10. The delay control circuit according to claim 9 comprising:

an input circuit having a n input terminal receiving the reference clock signal and producing an output signal supplied to a first input terminal of the phase comparator in the phase locked loop circuit;

the delay length control circuit having an input terminal supplied with an output signal from the VCO in the phase locked loop circuit, a clock terminal receiving the reference clock signal, and a control terminal receiving a control signal fed back from the output terminal of the output circuit, for delaying the output from the VCO and outputting it to a second input terminal of the phase comparator in the phase locked loop circuit;

a latch circuit for latching an input data signal in response to the output signal of the VCO; and a delay circuit for delaying an output of the latch circuit.

* * * * *